US012777766B2

(12) United States Patent
Kim

(10) Patent No.: US 12,777,766 B2
(45) Date of Patent: Oct. 27, 2026

(54) DISPLAY APPARATUS AND MANUFACTURING METHOD THEREFOR

(71) Applicant: Samsung Display Co., LTD., Yongin-si (KR)

(72) Inventor: Hyun Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 639 days.

(21) Appl. No.: 18/019,908

(22) PCT Filed: Sep. 10, 2020

(86) PCT No.: PCT/KR2020/012221
§ 371 (c)(1),
(2) Date: Feb. 6, 2023

(87) PCT Pub. No.: WO2022/034959
PCT Pub. Date: Feb. 17, 2022

(65) Prior Publication Data
US 2023/0282775 A1 Sep. 7, 2023

(30) Foreign Application Priority Data
Aug. 10, 2020 (KR) ........................ 10-2020-0099625

(51) Int. Cl.
*H10H 29/49* (2025.01)
*H10H 29/01* (2025.01)
(Continued)

(52) U.S. Cl.
CPC .......... *H10H 29/49* (2025.01); *H10H 29/012* (2025.01); *H10H 29/032* (2025.01);
(Continued)

(58) Field of Classification Search
CPC ... H01L 25/0753; H01L 25/167; H01L 33/62; H10H 20/857; H10H 29/857;
(Continued)

(56) References Cited

U.S. PATENT DOCUMENTS 11,380,664 B2 7/2022 Lee et al.
2012/0214266 A1 8/2012 Miyachi
(Continued)

FOREIGN PATENT DOCUMENTS

CN 105742449 7/2016
CN 113327957 8/2021
(Continued)

OTHER PUBLICATIONS

J. Semple et al., "Large-area plastic nanogap electronics enabled by adhesion lithography", npj Flexible Electronics, Jun. 25, 2018, pp. 1-10.

*Primary Examiner* — Lauren R Bell
(74) *Attorney, Agent, or Firm* — Womble Bond Dickinson (US) LLP

(57) ABSTRACT

Provided are a display apparatus and a manufacturing method therefor. The manufacturing method for the display apparatus includes preparing a substrate on which a first electrode and a second electrode are formed, disposing a light emitting element between the first electrode and the second electrode, forming a sacrificial pattern on the light emitting element, the sacrificial pattern exposing an end portion and another end portion of the light emitting element, forming a contact electrode layer on the sacrificial pattern, and the end portion and the another end portion of the light emitting element, and forming a first contact electrode and a second contact electrode by removing a portion of the contact electrode layer formed on the sacrificial pattern.

6 Claims, 32 Drawing Sheets

(51) Int. Cl.
*H10H 29/80* (2025.01)
*H10W 90/00* (2026.01)

(52) U.S. Cl.
CPC ...... *H10H 29/034* (2025.01); *H10H 29/8321* (2025.01); *H10H 29/842* (2025.01); *H10W 90/00* (2026.01)

(58) Field of Classification Search
CPC .... H10H 29/49; H10H 29/032; H10H 29/034; H10H 29/8321; H10H 29/842
See application file for complete search history.

(56) References Cited

U.S. PATENT DOCUMENTS

| | | | | |
|---|---|---|---|---|
| 2016/0043341 | A1 | 2/2016 | Heo et al. | |
| 2018/0012876 | A1* | 1/2018 | Kim | H10W 90/00 |
| 2019/0326348 | A1* | 10/2019 | Im | G09G 3/32 |
| 2021/0202452 | A1* | 7/2021 | Kim | H10H 20/857 |
| 2021/0249575 | A1 | 8/2021 | Lee et al. | |
| 2021/0272938 | A1* | 9/2021 | Chang | H10D 86/40 |
| 2021/0288217 | A1* | 9/2021 | Li | H10H 20/84 |
| 2021/0351171 | A1* | 11/2021 | Yoo | H10D 86/40 |
| 2022/0052032 | A1* | 2/2022 | Li | H10D 86/0231 |
| 2022/0059739 | A1* | 2/2022 | Li | H10H 20/84 |
| 2022/0085243 | A1* | 3/2022 | Chang | H10D 86/021 |
| 2022/0320059 | A1 | 10/2022 | Lee et al. | |
| 2022/0406840 | A1* | 12/2022 | Lee | H10H 20/01 |
| 2023/0268463 | A1* | 8/2023 | Sakamoto | H10H 20/01 257/79 |

FOREIGN PATENT DOCUMENTS

| | | | | |
|---|---|---|---|---|
| CN | 113394249 | | 9/2021 | |
| KR | 10-2019-0042130 | | 4/2019 | |
| KR | 10-2019-0067296 | | 6/2019 | |
| KR | 10-2020-0010704 | | 1/2020 | |
| KR | 10-2020-0034904 | | 4/2020 | |
| KR | 10-2020-0060602 | | 6/2020 | |
| KR | 10-2020-0070493 | | 6/2020 | |
| KR | 10-2021-0103048 | | 8/2021 | |
| KR | 10-2021-0109699 | | 9/2021 | |
| WO | WO-2020017718 | A1 * | 1/2020 | H10H 20/831 |
| WO | WO-2020017746 | A1 * | 1/2020 | H10W 90/00 |
| WO | WO-2020059989 | A1 * | 3/2020 | H10W 90/00 |
| WO | WO-2020116732 | A1 * | 6/2020 | H10P 50/69 |
| WO | WO-2020130249 | A1 * | 6/2020 | H10W 90/00 |

* cited by examiner

DISPLAY APPARATUS AND MANUFACTURING METHOD THEREFOR

CROSS REFERENCE TO RELATED APPLICATION(S)

This application is a national entry of International Application No. PCT/KR2020/012221, filed on Sep. 10, 2020, which claims under 35 U.S.C. §§ 119(a) and 365(b) priority to and benefits of Korean Patent Application No. 10-2020-0099625, filed on Aug. 10, 2020, in the Korean Intellectual Property Office (KIPO), the entire content of which are incorporated herein by reference.

BACKGROUND

1. Technical Field

The disclosure relates to a display apparatus and a manufacturing method therefor.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

SUMMARY

An object of the disclosure is to provide a display apparatus in which a mask process is reduced to improve process efficiency.

Another object of the disclosure is to provide a manufacturing method for a display apparatus in which a mask process is reduced to improve process efficiency.

It should be noted that aspects of the disclosure are not limited thereto and other aspects, which are not mentioned herein, will be apparent to those of ordinary skill in the art from the following description.

According to an embodiment of the disclosure, a manufacturing method for a display apparatus may include preparing a substrate in which a first electrode and a second electrode are formed, disposing a light emitting element between the first electrode and the second electrode, forming a sacrificial pattern, which exposes an end portion and another end portion of the light emitting element, on the light emitting element, forming a contact electrode layer on the sacrificial pattern, and the end portion and the another end portion of the light emitting element, which are exposed by the sacrificial pattern, and forming a first contact electrode and a second contact electrode by removing a portion of the contact electrode layer that is formed on the sacrificial pattern.

The sacrificial pattern may have a tapered shape in a cross-sectional view.

The contact electrode layer may include a first area that is formed on the sacrificial pattern and has a first thickness in a thickness direction of the substrate, a second area that is formed on the end portion and the another end portion of the light emitting element, which are exposed by the sacrificial pattern, and has a second thickness in the thickness direction, and a third area that does not overlap the light emitting element and has a third thickness in the thickness direction, and the first thickness may be smaller than the second thickness and the third thickness.

The forming of the first contact electrode and the second contact electrode may be performed by front etching using an etchant.

An etching selectivity of the etchant with the sacrificial pattern may be greater than an etching selectivity of the etchant with the contact electrode layer.

The first area having the first thickness formed on the sacrificial pattern may be etched to expose the sacrificial pattern during the forming of the first contact electrode and the second contact electrode, and the sacrificial pattern may be etched by the etchant.

The sacrificial pattern may include a self-assembled monolayer.

The forming of the first contact electrode and the second contact electrode may include forming a glue layer on a surface of the contact electrode layer, and removing the glue layer.

The contact electrode layer may include a first portion that overlaps the sacrificial pattern and the glue layer in a thickness direction of the substrate, and a second portion that does not overlap the sacrificial pattern and overlaps the glue layer in the thickness direction, and in the removing of the glue layer, the first portion of the contact electrode layer may be removed by being attached to a surface of the glue layer, to form the first contact electrode and the second contact electrode.

The manufacturing method may further include removing the sacrificial pattern after the removing of the glue layer.

According to another embodiment of the disclosure, a manufacturing method for a display apparatus may include preparing a substrate in which a first electrode and a second electrode are formed, disposing a light emitting element between the first electrode and the second electrode, forming a first contact electrode on the first electrode and an end portion of the light emitting element, forming a sacrificial pattern, which covers the first contact electrode, on the first contact electrode, forming a second contact electrode layer on the sacrificial pattern and another end portion of the light emitting element, and forming a second contact electrode by removing a portion of the second contact electrode layer formed on the sacrificial pattern.

The sacrificial pattern may include a self-assembled monolayer.

The forming of the second contact electrode may include forming a glue layer on a surface of the second contact electrode layer, and removing the glue layer.

The second contact electrode layer may include a first portion that overlaps the sacrificial pattern and the glue layer in a thickness direction of the substrate, and a second portion that does not overlap the sacrificial pattern and overlaps the glue layer in the thickness direction, and in the removing of the glue layer, the first portion of the second contact electrode layer may be removed by being attached to a surface of the glue layer, to form the second contact electrode.

According to an embodiment of the disclosure, a display apparatus may include a substrate, a light emitting element disposed on the substrate, a first contact electrode electrically contacting an end portion of the light emitting element, and a second contact electrode electrically contacting another end portion of the light emitting element. The first contact electrode and the second contact electrode may be spaced apart from each other to face each other, and an end portion of the second contact electrode, which faces the first contact electrode, may have a reverse tapered shape in a cross-sectional view.

An end portion of the first contact electrode, which faces the second contact electrode, may have a reverse tapered shape in a cross-sectional view.

The end portion of the second contact electrode may be disposed on the another end portion of the light emitting element. The second contact electrode may include a first area that overlaps the light emitting element in a thickness direction of the substrate, and a second area that does not overlap the light emitting element in the thickness direction. A thickness of first area may be smaller than a thickness of the second area in the thickness direction.

At least an area of an upper surface of the second contact electrode may have a surface roughness.

The second contact electrode may have a surface roughness on the upper surface in an area that overlaps the light emitting element in a thickness direction of the substrate, and the first contact electrode may have a surface roughness on an upper surface in an area that overlaps the light emitting element in the thickness direction.

The display apparatus may further include an insulating layer disposed on the first contact electrode and the second contact electrode. The insulating layer may include a first portion disposed on the first and second contact electrodes, and a second portion disposed between the first contact electrode and the second contact electrode. The first portion and the second portion may be integral with each other.

The details of other embodiments are included in the detailed description and the accompanying drawings.

According to an embodiment of the disclosure, a first contact electrode and a second contact electrode are formed using a sacrificial pattern through the same process, so that the number of masks may be reduced, whereby process efficiency of the display apparatus may be improved.

The effects according to the embodiments are not limited by the contents described above, and more various effects are included in this disclosure.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be more thorough and complete, and will fully convey the scope of the disclosure to those skilled in the art.

It will also be understood that when a layer is referred to as being “on” another layer or substrate, it can be directly on the other layer or substrate, or intervening layers may also be present. The same reference numbers indicate the same components throughout the specification.

It will be understood that, although the terms “first,” “second,” etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

Hereinafter, embodiments will be described with reference to the accompanying drawings.

Figure 1:
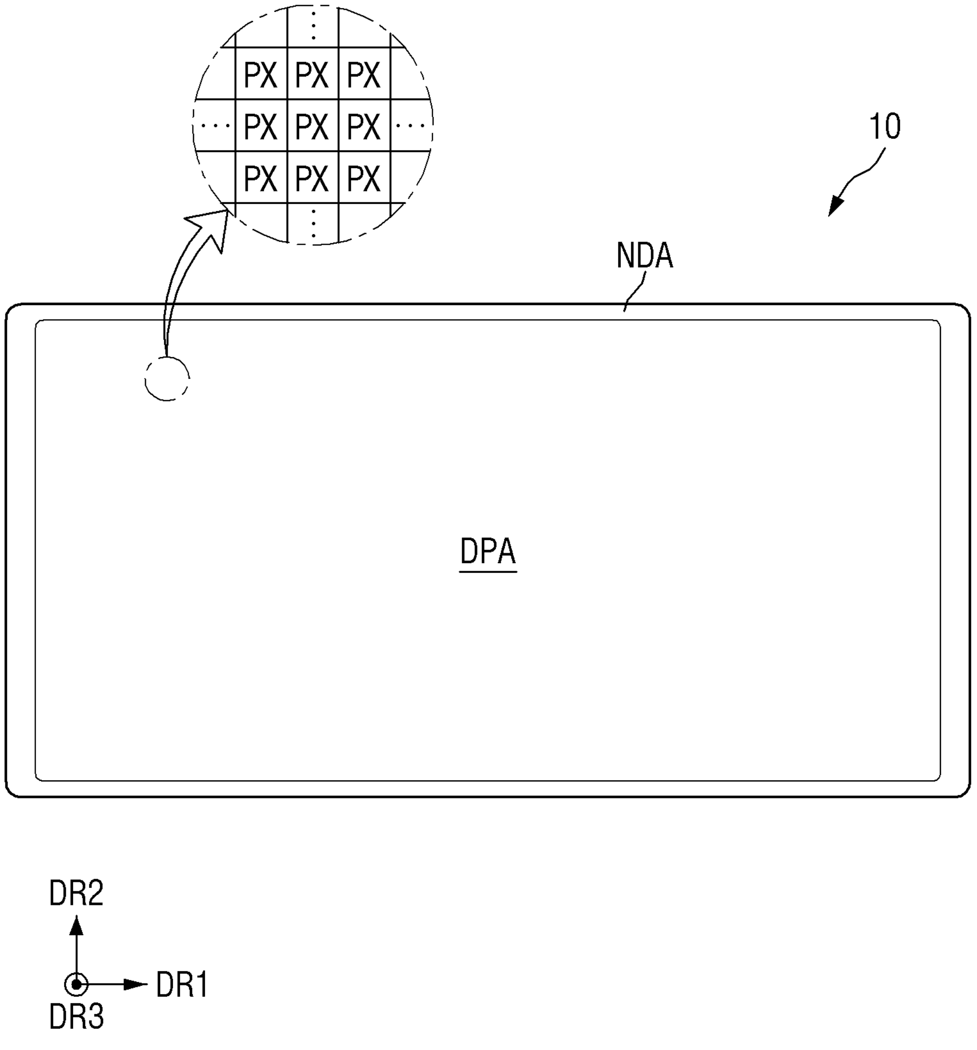
FIG. 1 is a plan view illustrating a display apparatus according to an embodiment.

FIG. 1 is a schematic plan view of a display device according to an embodiment.

Referring to FIG. 1, a display apparatus 10 may display a moving image or a still image. The display apparatus 10 may refer to all electronic devices that provide a display screen. For example, a television, a laptop computer, a monitor, an advertising board, an Internet of things (IoT) device, a mobile phone, a smartphone, a tablet personal computer (PC), an electronic watch, a smartwatch, a watch phone, a head-mounted display, a mobile communication terminal, a digital diary, an e-book reader, a portable multimedia player (PMP), a navigation system, a game machine, a digital camera, a camcorder and the like, which provide a display screen, may be included in the display apparatus 10.

The display apparatus 10 may include a display panel for providing a display screen. Examples of the display panel include an inorganic light emitting diode display panel, an organic light emitting display panel, a quantum dot light emitting display panel, a plasma display panel, and a field emission display panel. Hereinafter, an inorganic light emitting diode display panel is applied as an example of a display panel, but the disclosure is not limited thereto. Other display panel may be used as long as the same technical spirits are applicable thereto.

Hereinafter, in the drawing of the embodiment in which the display apparatus 10 is described, a first direction DR1, a second direction DR2, and a third direction DR3 are defined. The first direction DR2 and the second direction DR2 may be directions perpendicular to each other on a plane. The third direction DR3 may be perpendicular to the first direction DR1 and the second direction DR2. The third direction DR3 may be perpendicular to each of the first direction DR1 and the second direction DR2. In the embodiment in which the display apparatus 10 is described, the third direction DR3 may be a thickness direction (or display direction) of the display apparatus 10.

The display apparatus 10 may have a rectangular shape that includes a long side longer in the first direction DR1 than in the second direction DR2 and a short side in a plan view. A corner portion where the long side and the short side of the display apparatus 10 meet each other in a plan view may have a right angle, but the disclosure is not limited thereto, and the corner portion may have a rounded corner shape. The shape of the display apparatus 10 is not limited to the illustrated example and may be modified. For example, the display apparatus 10 may have other shapes such as a square shape, a square shape with rounded corners (vertices), other polygonal shape, and a circular shape in a plan view.

A display surface of the display apparatus 10 may be disposed at a side in the third direction DR3 that is a thickness direction. In the embodiments in which the display apparatus 10 is described, unless otherwise mentioned, "upper portion" may be the display direction at the side in the third direction DR3, and "upper surface" may be a surface oriented toward the side in the third direction DR3. Also, "lower portion" may be an opposite direction of the display direction at the other side in the third direction DR3, and "lower surface" may be a surface oriented toward the other side in the third direction DR3. Also, "left", "right", "upper" and "lower" may be directions when the display apparatus 10 is viewed in a plan view. For example, "right side" may be a side in the first direction DR1, "left side" may be another side of the first direction DR1, "upper side" may be a side in the second direction DR2, and "lower side" may be another side in the second direction DR2.

The display apparatus 10 may include a display area DPA and a non-display area NDA. The display area DPA may be an area in which an image may be displayed, and the non-display area NDA may be an area in which no image is displayed.

The display area DPA may have a shape similar to the shape of the display apparatus 10. For example, the display apparatus DPA may have a rectangular shape similar to an overall shape of the display apparatus 10 in a plan view. The display area DPA may generally occupy the center of the display apparatus 10.

The display area DPA may include multiple pixels PX. The pixels PX may be arranged in a matrix direction. A shape of each pixel PX may be a rectangular or square shape in a plan view. In an embodiment, each pixel PX may include multiple light emitting elements made of inorganic particles.

The non-display area NDA may be disposed in the vicinity of the display area DPA. The non-display area NDA may fully or partially surround the display area DPA. The non-display area NDA may constitute a bezel of the display apparatus 10.

Figure 2:
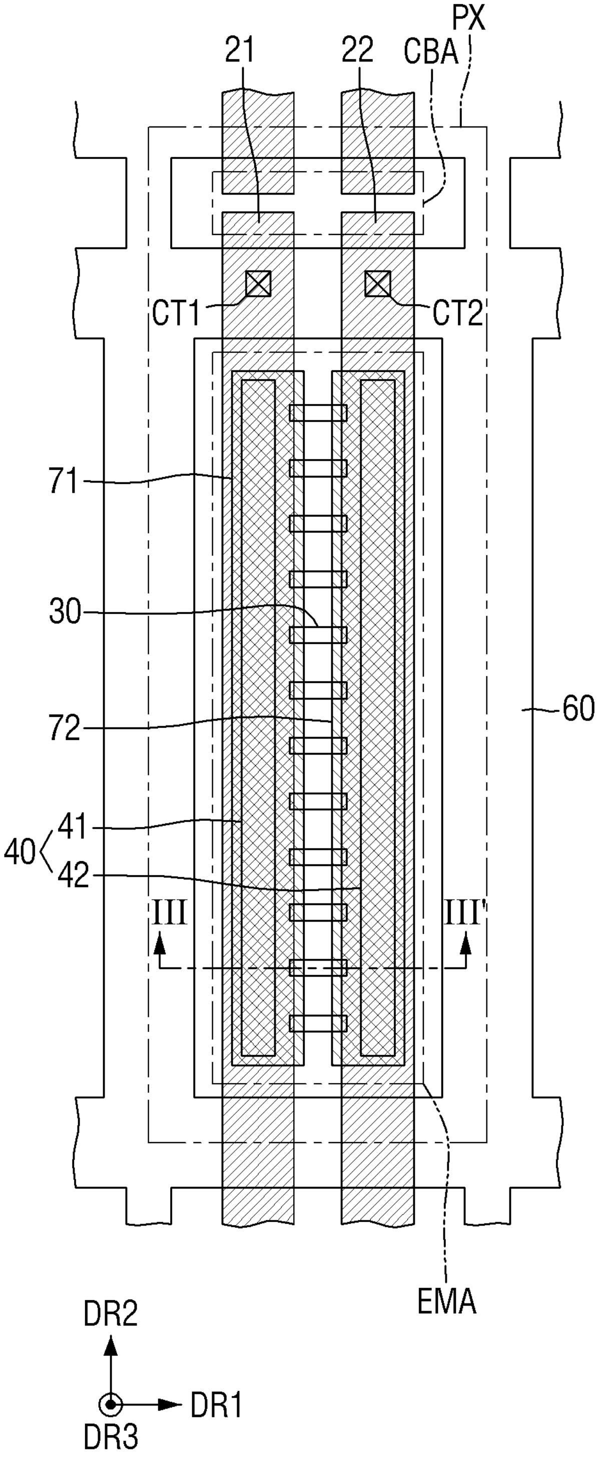
FIG. 2 is a plan view illustrating one pixel of a display apparatus according to an embodiment.
Figure 3:
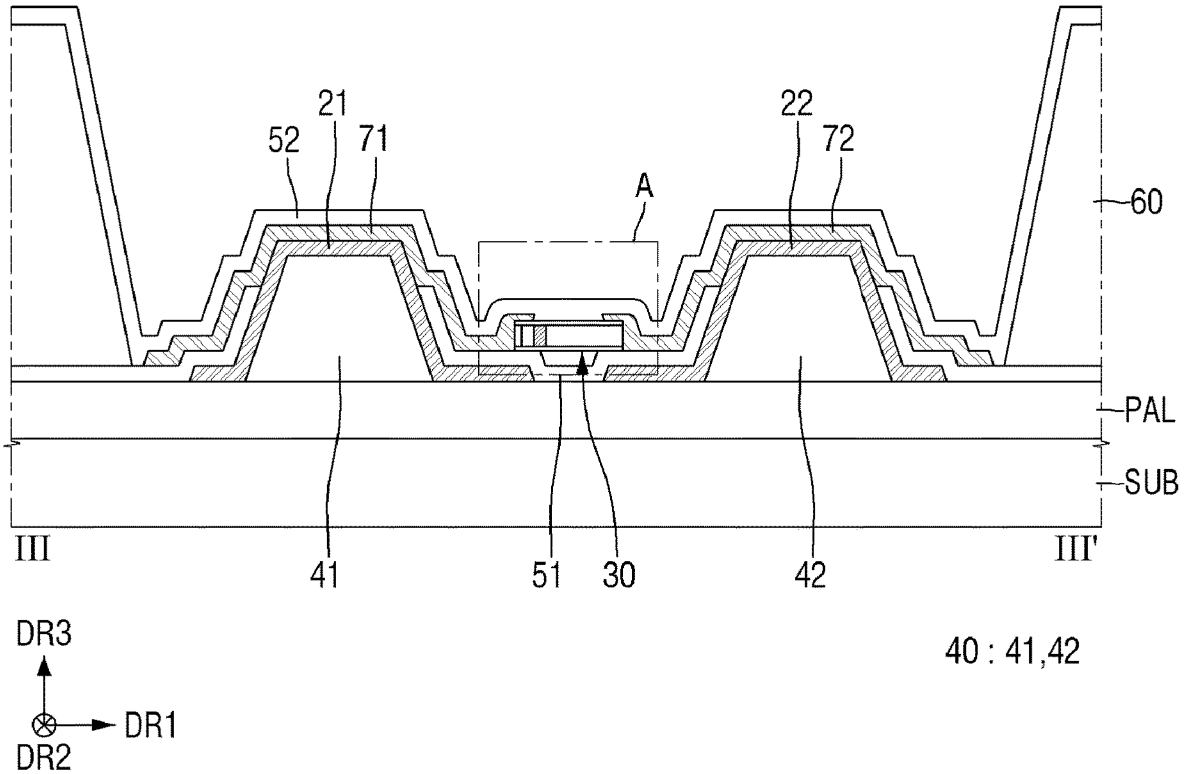
FIG. 3 is a schematic cross-sectional view taken along line III-III' of FIG. 2.

FIG. 2 is a schematic plan view illustrating a pixel of a display apparatus according to an embodiment. FIG. 3 is a schematic cross-sectional view taken along line III-III' of FIG. 2.

Referring to FIG. 2, each pixel PX of the display apparatus 10 may include a light emission area EMA and a non-light emission area (not referenced). The light emission area EMA may be an area in which light emitted from a light emitting element 30 is emitted, and the non-light emission area may be defined as an area which light emitted from the light emitting element 30 does not reach and thus from which no light is emitted.

The light emission area EMA may include an area in which the light emitting element 30 is disposed and its adjacent area. The light emission area may further include an area which the light emitted from the light emitting element 30 is emitted by being reflected or refracted by another member.

Each pixel PX may include a cut area CBA disposed in the non-light emission area. The cut area CBA may be disposed at an upper side (or a side in the second direction DR2) of the light emission area EMA in a pixel PX. The cut area CBA may be disposed between the light emission areas EMA of adjacent pixels PX in the second direction DR2.

The cut area CBA may be an area in which electrodes 21 and 22 included in the respective pixels PX adjacent to each other are separated from each other in the second direction DR2. The electrodes 21 and 22 disposed in each pixel PX may be separated from each other in the cut area CBA, and portions of the electrodes 21 and 22 disposed in each pixel PX may be disposed in the cut area CBA. The light emitting element 30 may not be disposed in the cut area CBA.

Referring to FIGS. 2 and 3, the display apparatus 10 may include a substrate SUB, a circuit element layer PAL disposed on the substrate SUB, and a light emitting element layer disposed on the circuit element layer PAL. The light emitting element layer may include a first bank 40, first and second electrodes 21 and 22, a second bank 60, a light emitting element 30, first and second contact electrodes 71 and 72, a first insulating layer 51, and a second insulating layer 52.

The substrate SUB may be an insulating substrate. The substrate SUB may be formed of an insulating material such as glass, quartz, or a polymer resin. The substrate SUB may be a rigid substrate, but may be a flexible substrate capable of being subjected to bending, folding, rolling, or the like.

The circuit element layer PAL may be disposed on the substrate SUB. The circuit element layer PAL may include at least one transistor to drive the light emitting element layer.

The first bank 40 may be disposed on the circuit element layer PAL. Although not shown in the drawing, the circuit element layer PAL may include a via layer, and the first bank 40 may be disposed on the via layer of the circuit element layer PAL.

The first bank 40 may include a shape extended in the second direction DR2 in each pixel PX in a plan view. The first bank 40 may include first and second sub banks 41 and 42 spaced apart from each other. A space in which the first and second sub banks 41 and 42 are spaced apart from each other may provide an area in which the light emitting elements 30 are disposed.

The first and second sub banks 41 and 42 may have a structure in which at least portions of the first and second sub banks 41 and 42 is protruded from an upper surface of the substrate SUB. The protruded portions of the first and second sub banks 41 and 42 may have inclined sides. Since the first and second sub banks 41 and 42 include inclined sides, the first and second sub banks 41 and 42 may serve to change a moving direction of light, which is emitted from the light emitting element 30 and moved toward the sides of the first and second sub banks 41 and 42, to an upward direction (e.g., display direction).

The first and second electrodes 21 and 22 may be disposed on the first and second sub banks 41 and 42, respectively. The first and second electrodes 21 and 22 may be spaced apart from each other.

The first electrode 21 may be extended in the second direction DR2 in a plan view so as to overlap an area of the second bank 60 extended in the first direction DR1. The first electrode 21 may be electrically connected to the circuit element layer PAL through a first contact hole CT1.

The second electrode 22 may be extended in the second direction DR2 in a plan view so as to overlap an area of the second bank 60 extended in the first direction DR1. The second electrode 22 may be electrically connected to the circuit element layer PAL through a second contact hole CT2.

The first and second electrodes 21 and 22 may be electrically connected to the light emitting elements 30, respectively, and a voltage (e.g., a predetermined or selectable voltage) may be applied to the light emitting element 30 to emit light. For example, the electrodes 21 and 22 may be electrically connected to the light emitting element 30 disposed between the first electrode 21 and the second electrode 22 through the contact electrodes 71 and 72 that will be described below, and may transfer electrical signals, applied to the electrodes 21 and 22, to the light emitting element 30 through the contact electrodes 71 and 72.

The first insulating layer 51 may be disposed on the electrodes 21 and 22. The first insulating layer 51 may be disposed on the first electrode 21 and the second electrode 22 to expose at least portions of the first electrode 21 and the second electrode 22. The first insulating layer 51 may protect the first electrode 21 and the second electrode 22 and insulate the first electrode 21 and the second electrode 22 from each other. The light emitting element 30 disposed on the first insulating layer 51 may be prevented from being damaged by directly contacting other members.

The second bank 60 may be disposed on the first insulating layer 51. The second bank 60 may include portions extended in the first direction DR1 and the second direction DR2 in a plan view, and may be arranged in a lattice pattern. The second bank 60 may be formed to have a height greater than that of the first bank 40. The second bank 60 may perform a function of preventing ink from overflowing to an adjacent pixel PX (not shown) during an inkjet printing process of the manufacturing process of the display apparatus 10.

The light emitting element 30 may be disposed on the first insulating layer 51 between the electrodes 21 and 22. The light emitting element 30 may have a shape extended in a direction. The light emitting element 30 may have a shape extended in a direction, and a direction in which the electrodes 21 and 22 are extended may be substantially perpendicular to the direction in which the light emitting element 30 is extended.

The first and second contact electrodes 71 and 72 may be disposed on the first and second electrodes 21 and 22, respectively. The first and second contact electrodes 71 and 72 may be spaced apart from each other. The first contact electrode 71 may include an end portion spaced apart from the second contact electrode 72 to face the second contact electrode 72, and the second contact electrode 72 may include an end portion spaced apart from the first contact electrode 71 to face the first contact electrode 71. In the disclosure, an end portion of each of the first and second contact electrodes 71 and 72 may refer to an end portion disposed at each of sides spaced apart from each other to face each other.

The first and second contact electrodes 71 and 72 may have a shape extended in a direction in a plan view. Each of the first contact electrode 71 and the second contact electrode 72 may have a shape extended in the second direction DR2. The first contact electrode 71 and the second contact electrode 72 may be spaced apart from each other in the first direction DR1 to face each other.

The first contact electrode 71 may contact the first electrode 21 and an end portion of the light emitting element 30. The first contact electrode 71 may be disposed on the first electrode 21, so that its area may contact a surface of the first electrode 21 exposed by the first insulating layer 51 and its another area may contact an end portion of the light emitting element 30.

The second contact electrode 72 may contact the second electrode 22 and another end of the light emitting element 30. The second contact electrode 72 may be disposed on the second electrode 22, so that its area may contact a surface of the second electrode 22 exposed by the first insulating layer 51 and its another area may contact the another end of the light emitting element 30.

The first contact electrode 71 and the second contact electrode 72 may be disposed in parallel on the light emitting element 30. The first contact electrode 71 and the second contact electrode 72 may be spaced apart from each other on the light emitting element 30 to face each other. The first contact electrode 71 and the second contact electrode 72 may be spaced apart from each other on the light emitting element 30 to expose a portion of the light emitting element 30. The light emitting element 30 exposed by the first contact electrode 71 and the second contact electrode 72 may contact the second insulating layer 52, which will be described below, in the exposed area. In an area adjacent to the light emitting element 30, the first contact electrode 71 and the second contact electrode 72 may have different thicknesses for each area. This will be described below in detail with reference to FIG. 5.

The second insulating layer 52 may be entirely disposed on the substrate SUB. The second insulating layer 52 may serve to protect the members, disposed on the substrate SUB, from an external environment.

Figure 4:
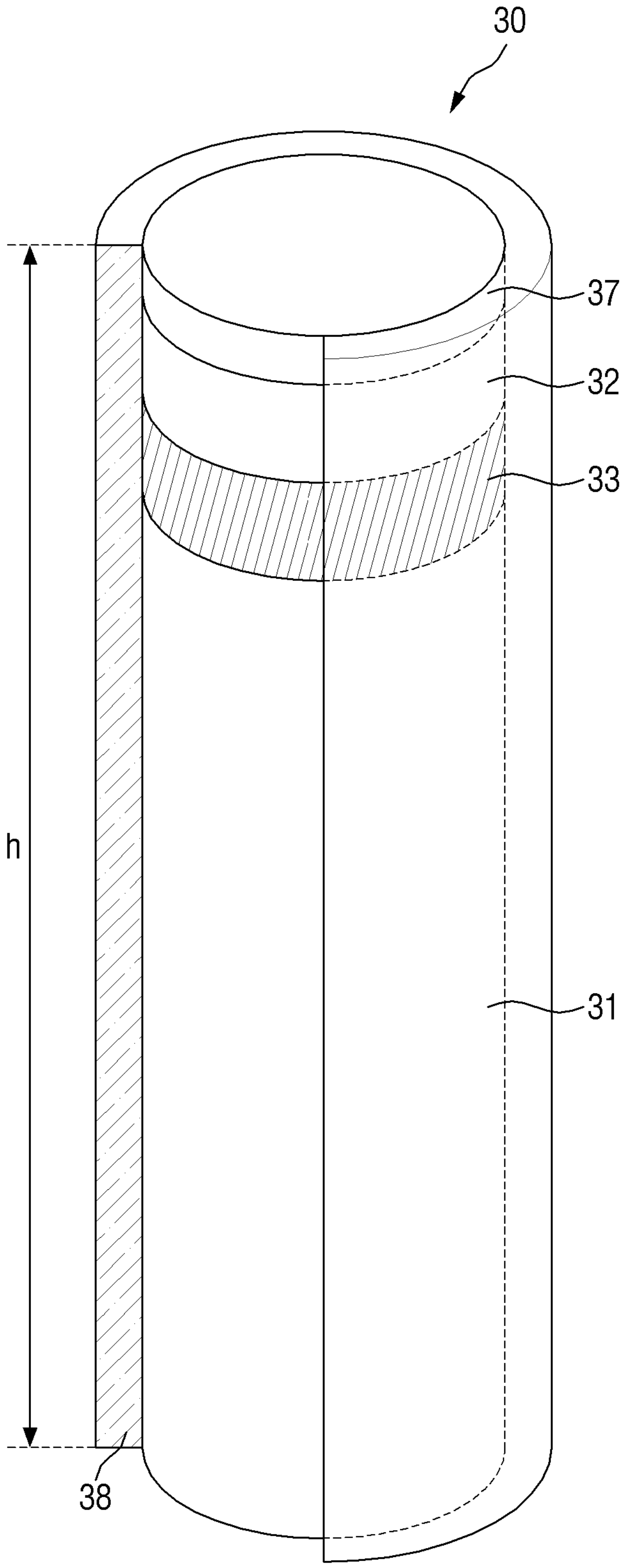
FIG. 4 is a schematic perspective view illustrating a light emitting element according to an embodiment.

FIG. 4 is a schematic perspective view illustrating a light emitting element according to an embodiment.

Referring to FIG. 4, the light emitting element 30 may be a particle type element, and may have a rod or cylindrical shape having an aspect ratio (e.g., a predetermined or selectable aspect ratio). The light emitting element 30 may have a length greater than its diameter and may have an aspect ratio of about 3:1 to about 10:1, but the disclosure is not limited thereto.

The light emitting element 30 may have a size of a nano-meter scale (about 1 nm or more and less than about 1 um) to a micro-meter scale (about 1 um or more and less than about 1 mm). In an embodiment, both the diameter and the length of the light emitting element 30 may have a size of nano-meter scale or may have a size of a micro-meter scale. In some other embodiments, the diameter of the light emitting element 30 may have a size of a nano-meter scale, whereas the length of the light emitting element 30 may have a size of a micro-meter scale. In some embodiments, some of the light emitting elements 30 may have a diameter and/or length of a nano-meter scale, whereas others of the light emitting elements 30 may have a diameter and/or length of a micro-meter scale.

In an embodiment, the light emitting element 30 may be an inorganic light emitting diode. For example, the light emitting element 30 may include a semiconductor layer doped with a conductive type (e.g., p-type or n-type) impurities. The semiconductor layer may receive an electrical signal applied from an external power source, and thus may emit light of a specific wavelength range.

The light emitting element 30 according to an embodiment may include a first semiconductor layer 31, an active layer 33, a second semiconductor layer 32 and an electrode layer 37, which are sequentially stacked each other in a longitudinal direction. The light emitting element 30 may also include an insulating layer 38 surrounding outer surfaces of the first semiconductor layer 31, the second semiconductor layer 32, and the active layer 33.

The first semiconductor layer 31 may be a semiconductor having a first conductive type, for example, an n-type. The first semiconductor layer 31 may be doped with a first conductive type dopant, and for example, the first conductive dopant may be Si, Ge, Sn, etc. In an embodiment, the first semiconductor layer 31 may be n-GaN doped with n-type Si.

The second semiconductor layer 32 may be disposed to be spaced apart from the first semiconductor layer 31. The second semiconductor layer 32 may be a semiconductor having a second conductive type, for example, a p-type. The second semiconductor layer 32 may be doped with a second conductive dopant, and for example, the second conductive dopant may be Mg, Zn, Ca, Se, Ba, etc. In an embodiment, the second semiconductor layer 32 may be p-GaN doped with p-type Mg.

The active layer 33 may be disposed between the first semiconductor layer 31 and the second semiconductor layer 32. The active layer 33 may have a single or multiple quantum well structure. The active layer 33 may emit light by combination of electron-hole pairs in accordance with electrical signals applied through the first semiconductor layer 31 and the second semiconductor layer 32, but the disclosure is not limited thereto. The active layer 33 may have a structure in which a semiconductor material having a large band gap energy and a semiconductor material having a small band gap energy are alternately stacked each other, and may include group III to V semiconductor materials depending on a wavelength band of light that is emitted.

The light emitted from the active layer 33 may be emitted not only in the longitudinal direction of the light emitting element 30 but also on sides of the light emitting element 30. The directionality of the light emitted from the active layer 33 is not limited to a direction.

The electrode layer 37 may be disposed on the second semiconductor layer 32. The electrode layer 37 may be an ohmic connection electrode, but the disclosure is not limited thereto. The electrode layer 37 may be a Schottky contact electrode.

The electrode layer 37 may reduce resistance between the light emitting element 30 and an electrode or a contact electrode in case that the light emitting element 30 is electrically connected with the electrode or the contact electrode in the display apparatus 10. The electrode layer 37 may include a metal having conductivity. For example, the electrode layer 37 may include at least one of aluminum (Al), titanium (Ti), indium (In), gold (Au), silver (Ag), indium tin oxide (ITO), indium zinc oxide (IZO), or indium tin zinc oxide (ITZO). The electrode layer 37 may include a semiconductor material doped with an n-type or a p-type dopant.

The insulating layer 38 may be disposed to surround outer surfaces of the semiconductor layers and the electrode layers. In an embodiment, the insulating layer 38 may be disposed to surround at least the outer surface of the active layer 33, and may be extended in a direction in which the light emitting element 30 is extended. The insulating layer 38 may serve to protect the above members. For example, the insulating layer 38 may be formed to surround sides of the members and expose ends of the light emitting element 30 in the longitudinal direction. The insulating layer 38 may include materials having insulating properties. Therefore, the insulating layer 38 may prevent an electrical short that may occur in the active layer 33 in case that the active layer 33 directly contacts an electrode through which an electrical signal is transferred to the light emitting element 30. Also, the insulating layer 38 may protect the outer surface of the light emitting element 30 including the active layer 33, thereby preventing light emitting efficiency from being deteriorated.

Also, in some embodiments, the outer surface of the insulating layer 38 may be surface-treated. The light emitting element 30 may be aligned by being sprayed onto the electrode in a state that it is dispersed in an ink during the display apparatus 10 is manufactured. The surface of the insulating layer 38 may be hydrophobically or hydrophilically treated, so that the light emitting element 30 may be maintained to be dispersed in the ink without being agglomerated with another light emitting element 30 adjacent thereto.

Figure 5:
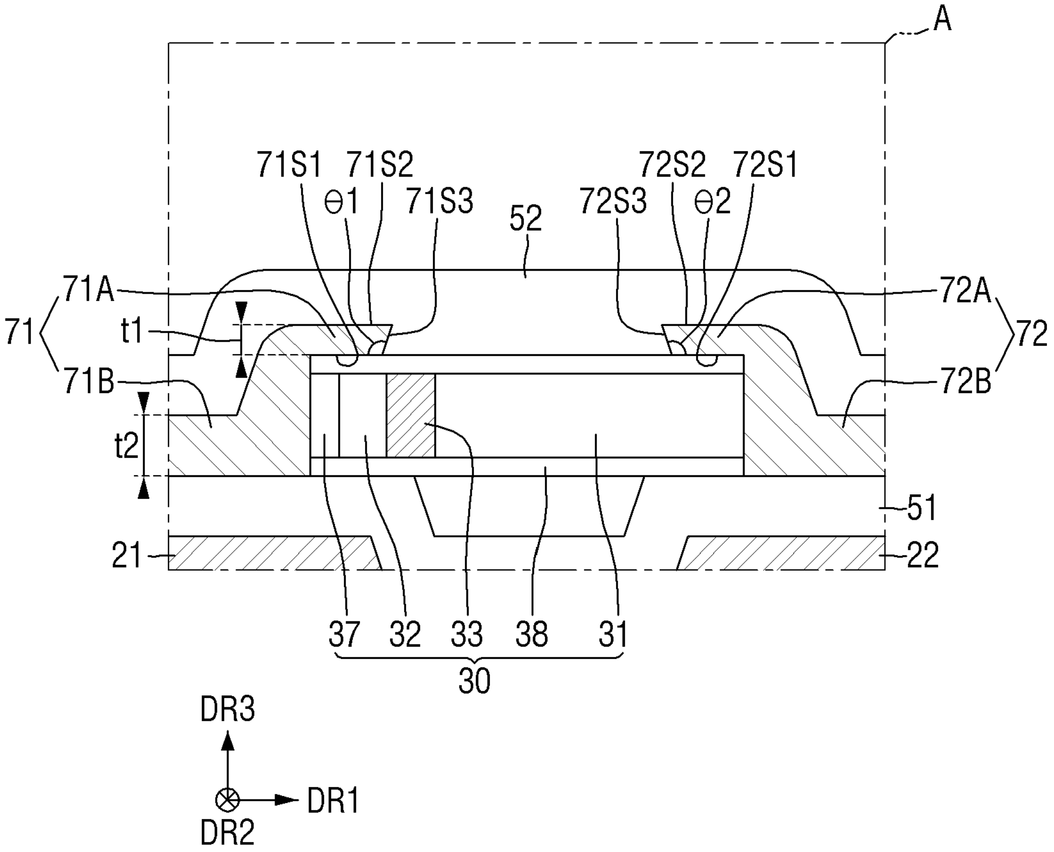
FIG. 5 is a schematic enlarged cross-sectional view of area A of FIG. 3 according to an embodiment.

FIG. 5 is a schematic enlarged cross-sectional view of area A of FIG. 3 according to an embodiment.

Referring to FIG. 5, the first contact electrode 71 (or an end portion of the first contact electrode 71) disposed adjacent to the light emitting element 30 may include a first area 71A disposed to overlap the light emitting element 30 in the third direction DR3 and a second area 71B disposed not to overlap the light emitting element 30 in the third direction DR3. The first area 71A of the first contact electrode 71 may be disposed on the light emitting element 30.

The first contact electrode 71 disposed on the light emitting element 30, for example, the first area 71A of the first contact electrode 71 may include a first surface 71S1, a second surface 71S2, and a third surface 71S3 in a cross-sectional view. The first surface 71S1 may be a surface that contacts the insulating layer 38 of the light emitting element 30, the second surface 71S2 may be a surface facing the first surface 71S1, and the third surface 71S3 may be a surface extending from the first surface 71S1 to the second surface 71S2. For example, the first surface 71S1 of the first contact electrode 71 may be a lower surface of the first area 71A of the first contact electrode 71, the second surface 71S2 of the first contact electrode 71 may be an upper surface of the first area 71A of the first contact electrode 71, and the third surface 71S3 of the first contact electrode 71 may be a side of the first area 71A of the first contact electrode 71. Hereinafter, the first surface 71S1, the second surface 71S2, and the third surface 71S3 of the first contact electrode 71 may be respectively referred to as the lower surface 71S1, the upper surface 71S2, and the side 71S3 of the first area 71A of the first contact electrode 71 disposed on the light emitting element 30.

Likewise, in an area adjacent to the light emitting element 30, the second contact electrode 72 may include a first area 72A disposed to overlap the light emitting element 30 in the third direction DR3 and a second area 72B disposed not to overlap the light emitting element 30 in the third direction DR3. The first area 72A of the second contact electrode 72 may be disposed on the light emitting element 30.

The second contact electrode 72 disposed on the light emitting element 30, for example, the first area 72A of the second contact electrode 72 may include a first surface 72S1, a second surface 72S2, and a third surface 72S3 in a cross-sectional view. For example, the first surface 72S1 of the second contact electrode 72 may be a lower surface of the first area 72A of the second contact electrode 72, the second surface 72S2 of the second contact electrode 72 may be an upper surface of the first area 72A of the second contact electrode 72, and the third surface 72S3 of the second contact electrode 72 may be a side of the first area 72A of the second contact electrode 72. Hereinafter, the first surface 72S1, the second surface 72S2, and the third surface 72S3 of the second contact electrode 72 may be respectively referred to as the lower surface 72S1, the upper surface 72S2, and the side 72S3 of the first area 72A of the second contact electrode 72 disposed on the light emitting element 30.

The first contact electrode 71 and the second contact electrode 72 may be disposed on the light emitting element 30 to be spaced apart from each other in the first direction DR1. The side 71S3 of the first contact electrode 71 and the side 72S3 of the second contact electrode 72 may face each other on the light emitting element 30.

A cross-sectional shape of an end portion of the first contact electrode 71, which is spaced apart from the second contact electrode 72 and faces the second contact electrode 72, may have a reverse tapered shape. Likewise, a cross-sectional shape of an end portion of the second contact electrode 72, which is spaced apart from the first contact electrode 71 and faces the first contact electrode 71, may have a reverse tapered shape.

For example, a cross-sectional shape of the first contact electrode 71 disposed on the light emitting element 30 may have a reverse tapered shape. In the disclosure, the reverse tapered shape may be defined as a shape in which the upper surface is more protruded than the lower surface to form an inclined side in a cross-sectional view. For example, in case that a cross-sectional shape is a reverse tapered shape, a size of an angle formed by the lower surface and the side may be an obtuse angle. A forward tapered shape may be defined as a shape in which the lower surface is more protruded than the upper surface to form an inclined side in a cross-sectional view. For example, in case that a cross-sectional shape is a forward tapered shape, the angle formed by the lower surface and the side may be an acute angle.

A cross-sectional shape of the first area 71A of the first contact electrode 71 may have a reverse tapered shape. Therefore, an angle formed by the lower surface 71S1 and the side 71S3 of the first area 71A of the first contact electrode 71 may be an obtuse angle. In an embodiment, a first taper angle θ1 formed by the lower surface 71S1 and the side 71S3 of the first area 71A of the first contact electrode 71 may be greater than about 90° and smaller than or equal to about 145°, but the disclosure is not limited thereto. The cross-sectional shape of an end portion of the first contact electrode 71 may have a forward tapered shape.

A cross-sectional shape of the second contact electrode 72 disposed on the light emitting element 30 may have a reverse tapered shape. A cross-sectional shape of the first area 72A of the second contact electrode 72 may have a reverse tapered shape. Therefore, an angle formed by the lower surface 72S1 and the side 72S3 of the first area 72A of the second contact electrode 72 may be an obtuse angle. In an embodiment, a second taper angle θ2 formed by the lower surface 72S1 and the side 72S3 of the second contact electrode 72 may be greater than about 90° and smaller than or equal to about 145°, but the disclosure is not limited thereto. The cross-sectional shape of an end portion of the second contact electrode 72 may have a forward tapered shape.

The first contact electrode 71 and the second contact electrode 72, which are disposed adjacent to the light emitting element 30, may have different thicknesses for each area.

The first contact electrode 71 disposed in the area adjacent to the light emitting element 30 may have a different thickness depending on a relative arrangement relation with the light emitting element 30. The first area 71A of the first contact electrode 71 disposed on the light emitting element 30 may have a first thickness t1, and the second area 71B of the first contact electrode 71 that is not disposed on the light emitting element 30 may have a second thickness t2 different from the first thickness t1 in the third direction DR3. The second thickness t2 may be greater than the first thickness t1.

A thickness relation between the first area 72A and the second area 72B of the second contact electrode 72 disposed in the area adjacent to the light emitting element 30 may be substantially the same as the first contact electrode 71. A description of the thicknesses of the first area 72A and the second area 72B of the second contact electrode 72 disposed in the area adjacent to the light emitting element 30 may be same as the description of the thicknesses of the first area 71A and the second area 71B of the first contact electrode 71.

The second insulating layer 52 may be disposed on the first contact electrode 71 and the second contact electrode 72. The second insulating layer 52 may be disposed on the first and second contact electrodes 71 and 72 including a space between the first contact electrode 71 and the second contact electrode 72, which are formed on the light emitting element 30, thereby completely covering the first and second contact electrodes 71 and 72.

The second insulating layer 52 may include a first portion disposed on the first contact electrode 71 and the second contact electrode 72 and a second portion disposed in the space between the first contact electrode 71 and the second contact electrode 72 on the light emitting element 30. The first portion and the second portion of the second insulating layer 52 may be a single layer without a separate boundary line. For example, the first portion and the second portion of the second insulating layer 52 may be integral with each other.

Hereinafter, a manufacturing process of the display apparatus of FIG. 3 will be described.

Figure 6:
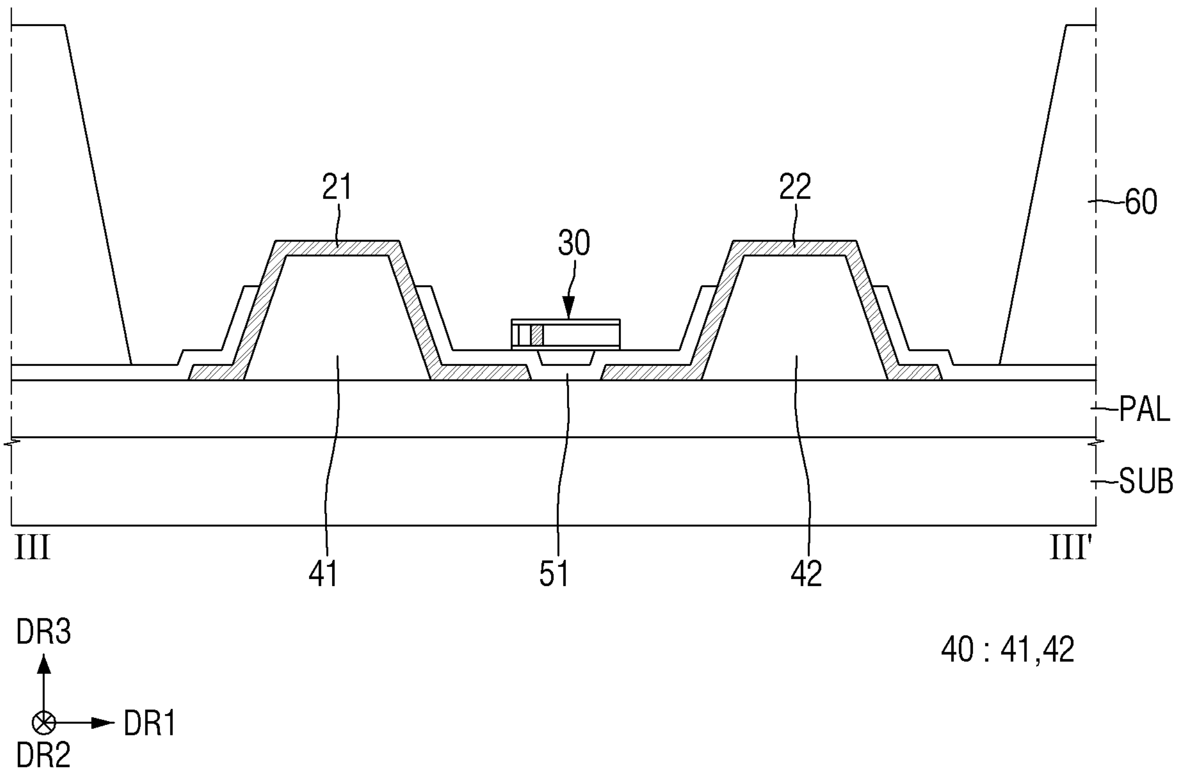
FIG. 6 is a schematic cross-sectional view illustrating a portion of a manufacturing process of a display apparatus of FIG. 3.

FIG. 6 is a schematic cross-sectional view illustrating a portion of a manufacturing process of a display apparatus of FIG. 3.

Referring to FIG. 6, a substrate SUB and a circuit element layer PAL formed on the substrate SUB may be prepared. A first bank 40, which includes a first sub bank 41 and a second sub bank 42, may be formed on the substrate SUB. The first sub bank 41 and the second sub bank 42 may be formed by a same mask process. A first electrode 21 and a second electrode 22 may be formed on the first sub bank 41 and the second sub bank 42, respectively. The first electrode 21 and the second electrode 22 may include a same material, and may be formed by a same mask process. A first insulating layer 51 may be formed on the first and second electrodes 21 and 22, a second bank 60 may be formed on the first insulating layer 51, and the light emitting element 30 may be disposed on the first insulating layer 51 between the first electrode 21 and the second electrode 22. The light emitting element 30 may be sprayed onto the substrate SUB through a printing process in a state that it is dispersed in the ink.

Figure 7:
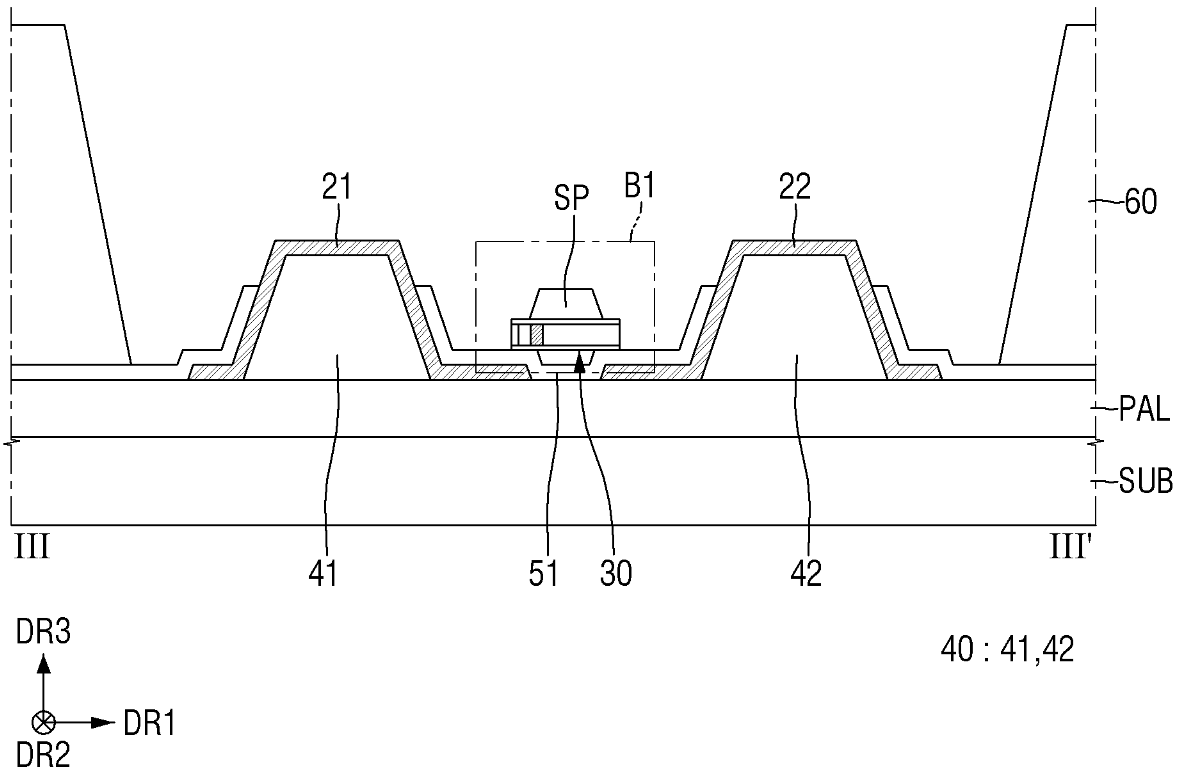
FIG. 7 is a schematic cross-sectional view illustrating a portion of a manufacturing process of a display apparatus of FIG. 3.
Figure 8:
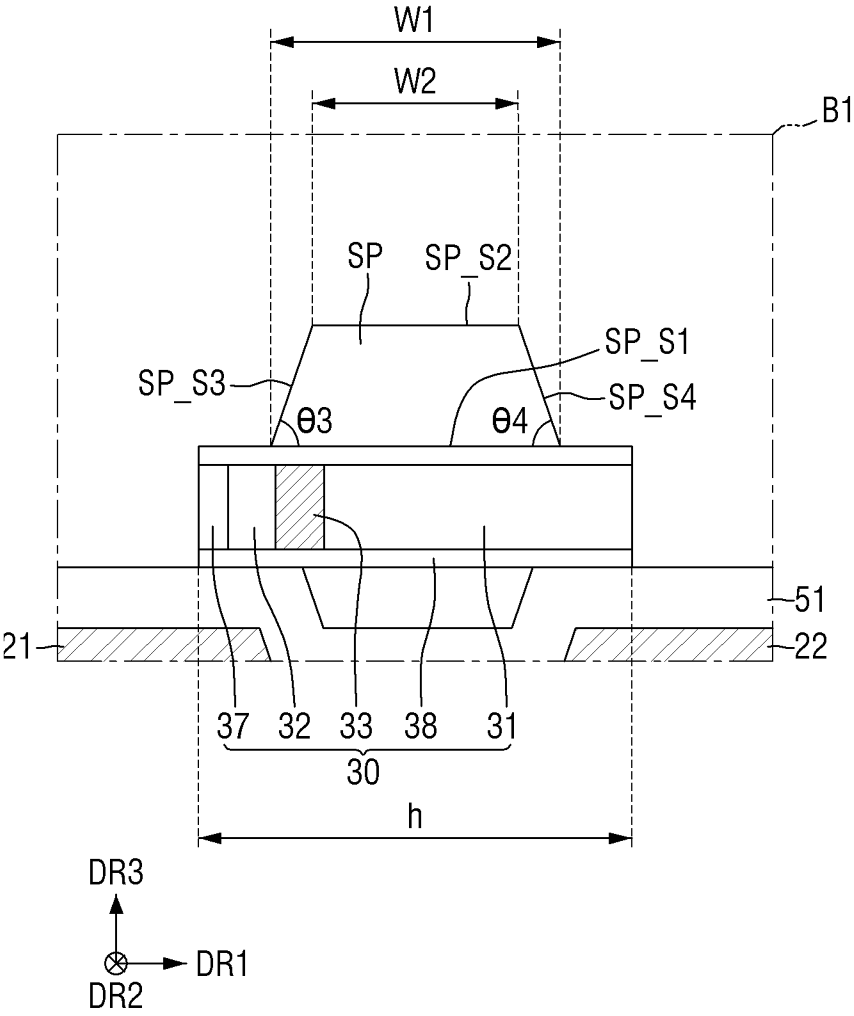
FIG. 8 is a schematic enlarged cross-sectional view of area B1 of FIG. 7.

FIG. 7 is a schematic cross-sectional view illustrating a portion of a manufacturing process of a display apparatus of FIG. 3. FIG. 8 is a schematic enlarged cross-sectional view of area B1 of FIG. 7.

Referring to FIGS. 7 and 8, a sacrificial pattern SP may be formed on the light emitting element 30. In the embodiment, the sacrificial pattern SP may be formed by a mask process. For example, a layer for a sacrificial layer may be entirely deposited on the first and second electrodes 21 and 22 and the first insulating layer 51. After a photoresist layer is coated on the layer for the sacrificial layer and a photoresist pattern is formed through exposure and development, the layer for the sacrificial layer may be etched using the photoresist pattern as an etching mask. The photoresist pattern may be removed through a stripping or ashing process to form the sacrificial pattern SP as shown in FIGS. 7 and 8.

The sacrificial pattern SP may include a lower surface SP_S1, an upper surface SP_S2, a first side SP_S3 and a second side SP_S4. A cross-sectional shape of the sacrificial pattern SP may include a forward tapered shape. A width W1 of the lower surface SP_S1 of the sacrificial pattern SP in a cross-sectional view may be greater than a width W2 of the upper surface SP_S2 of the sacrificial pattern SP. An angle formed by the lower surface SP_S1 of the sacrificial pattern SP and the first side SP_S3 of the sacrificial pattern SP may be an acute angle. In an embodiment, a third taper angle θ3 formed by the lower surface SP_S1 of the sacrificial pattern SP and the first side SP_S3 of the sacrificial pattern SP may be greater than or equal to about 35° and smaller than about 90°. Likewise, an angle formed by the lower surface SP_S1 of the sacrificial pattern SP and the second side SP_S4 of the sacrificial pattern SP may be an acute angle. In an embodiment, a fourth taper angle θ4 formed by the lower surface SP_S1 of the sacrificial pattern SP and the second side SP_S4 of the sacrificial pattern SP may be greater than or equal to about 35° and smaller than about 90°, but the disclosure is not limited thereto. The cross-sectional shape of the sacrificial pattern SP may have a reverse tapered shape.

The third taper angle θ3 of the sacrificial pattern SP may be a supplementary angle to the first taper angle θ1 of the first contact electrode 71. The fourth taper angle θ4 of the sacrificial pattern SP may be a supplementary angle to the second taper angle θ2 of the second contact electrode 72. The supplementary angle may be defined as an angle relative to another angle in case that a sum of two angles is about 180°. Since the first taper angle θ1 of the first contact electrode 71 and the second taper angle θ2 of the second contact electrode 72 are complementary to the third taper angle θ3 of the sacrificial pattern SP and the fourth taper angle θ4 of the sacrificial pattern SP, respectively, the cross-sectional shape of the sacrificial pattern SP may have a forward tapered shape, so that the cross-sectional shape of the first and second contact electrodes 71 and 72 formed by being deposited on the sacrificial pattern SP and etched may have a reverse tapered shape as shown in FIG. 5. Also, in order that a contact electrode layer 70 entirely deposited on the sacrificial pattern SP has a different thickness for each area, the third and fourth taper angles θ3 and θ4 of the sacrificial pattern SP may be greater than or equal to about 35° and smaller than about 90°, but the disclosure is not limited thereto.

The sacrificial pattern SP may be disposed on the first insulating layer 51 between the first electrode 21 and the second electrode 22. An area of the sacrificial pattern SP may be disposed on the light emitting element 30 between the first electrode 21 and the second electrode 22. The area of the sacrificial pattern SP disposed on the light emitting element 30 may expose at least portions of ends of the light emitting element 30. Therefore, a maximum width of the sacrificial pattern SP may be smaller than a length h of the light emitting element 30 in an extension direction. In an embodiment, the width W1 of the lower surface SP_S1 of the sacrificial pattern SP may be smaller than the length h of the light emitting element 30 in the extension direction. Since the maximum width of the sacrificial pattern SP is smaller than the length h of the light emitting element 30, the sacrificial pattern SP on the light emitting element 30 may expose the ends of the light emitting element 30.

The sacrificial pattern SP may include a material different from that included in the contact electrode layer 70 (see FIG. 9) that will be described below. For example, the sacrificial pattern SP may include a material having an etching selectivity different from that of the contact electrode layer 70 with an etchant for etching the contact electrode layer 70. This will be described below in detail.

Figure 9:
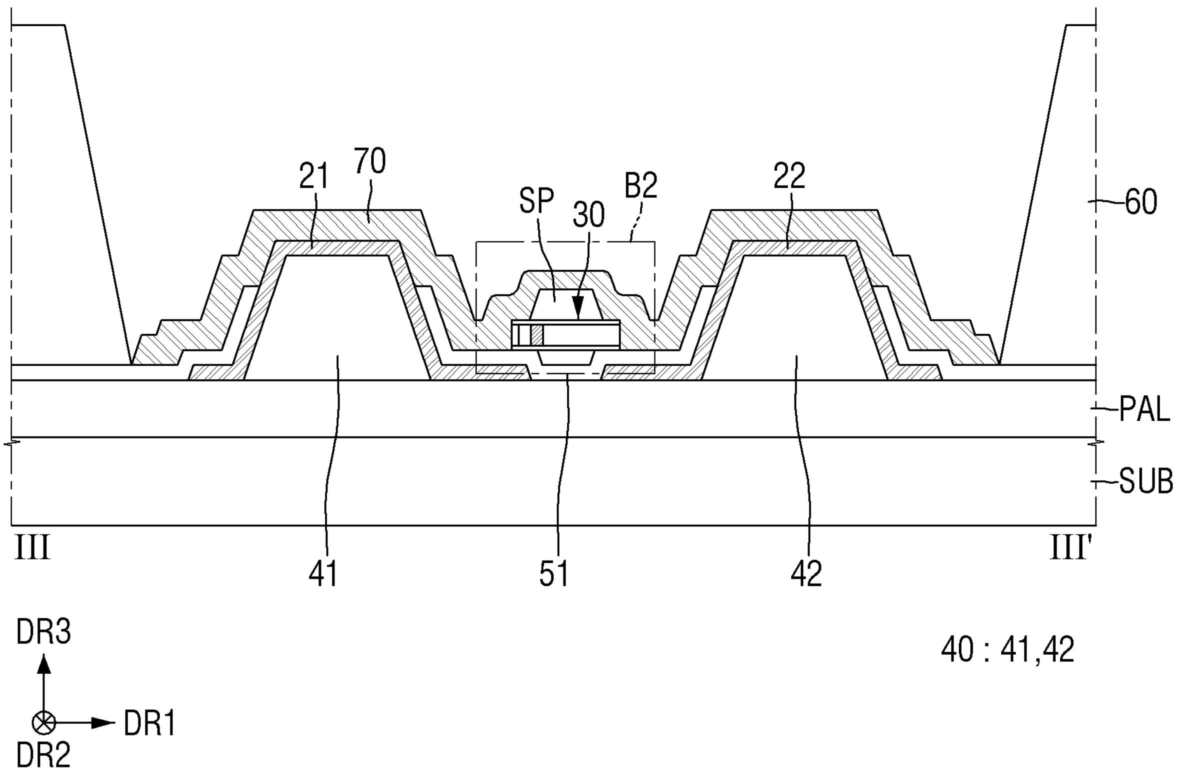
FIG. 9 is a schematic cross-sectional view illustrating a portion of a manufacturing process of a display apparatus of FIG. 3.
Figure 10:
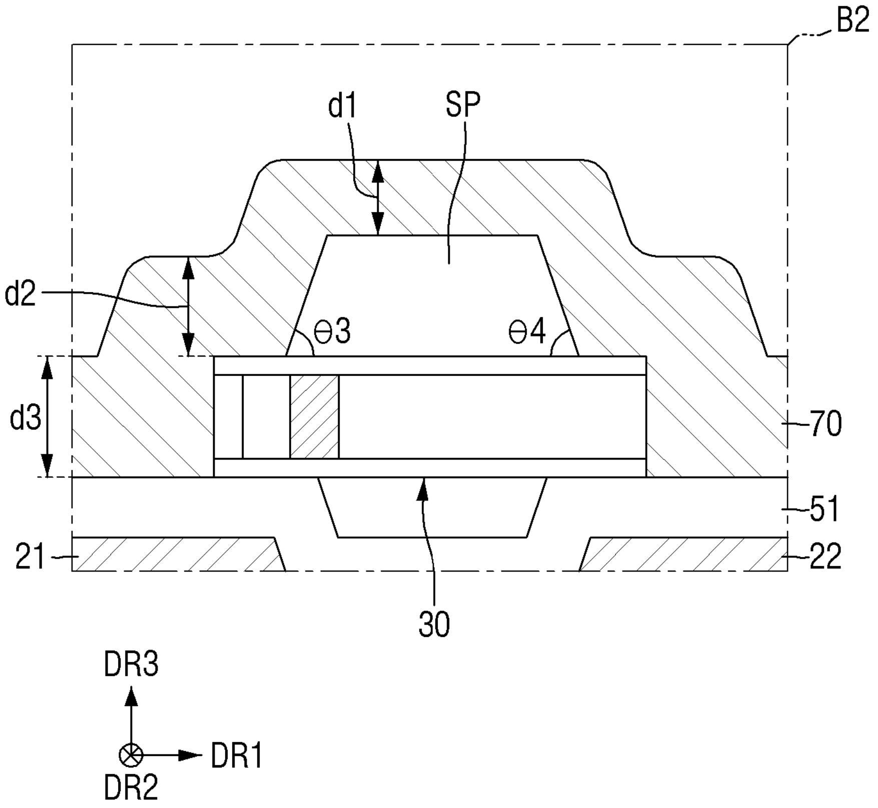
FIG. 10 is a schematic enlarged cross-sectional view of area B2 of FIG. 9.

FIG. 9 is a schematic cross-sectional view illustrating a portion of a manufacturing process of a display apparatus of FIG. 3. FIG. 10 is a schematic enlarged cross-sectional view of area B2 of FIG. 9.

Referring to FIGS. 9 and 10, the contact electrode layer 70 may be formed on the first and second electrodes 21 and 22, the first insulating layer 51, and the light emitting element 30, on which the sacrificial pattern SP is formed. The contact electrode layer 70 may be disposed on the sacrificial pattern SP and ends of the light emitting element 30, which are exposed by the sacrificial pattern SP. The contact electrode layer 70 may be extended outward to be disposed on the first and second electrodes 21 and 22 and the first insulating layer 51. For example, the contact electrode layer 70 may be entirely deposited on the substrate SUB.

The contact electrode layer 70 may be deposited to have a different thickness for each area by a step difference of the member disposed therebelow. For example, in the area adjacent to the light emitting element 30, the contact electrode layer 70 may be deposited to have a different thickness depending on a relative arrangement relation between the sacrificial pattern SP and the light emitting element 30. The contact electrode layer 70 may include a first area, a second area, and a third area in the area adjacent to the light emitting element 30. The first area of the contact electrode layer 70 may overlap the sacrificial pattern SP and the light emitting element 30, and may have a first thickness d1. The second area of the contact electrode layer 70 may be an area that overlaps the light emitting element 30 exposed by the sacrificial pattern SP and has a second thickness d2. The third area of the contact electrode layer 70 may be an area that does not overlap the sacrificial pattern SP and the light emitting element 30 and has a third thickness d3. The first thickness d1 may be smaller than the second thickness d2 and the third thickness d3, and the second thickness d2 may be smaller than the third thickness d3.

The contact electrode layer 70 may be deposited to have a different thickness due to a step difference formed by the sacrificial pattern SP and the light emitting element 30, which are disposed therebelow. Since the sacrificial pattern SP is formed to have the third and fourth taper angles θ3 and θ4 greater than or equal to about 35° and smaller than about 90°, the first thickness d1 of the first area of the contact electrode layer 70 formed on the sacrificial pattern SP may be smaller than the thickness of other areas. The contact electrode layer 70 may include ITO, IZO, ITZO, etc., but the disclosure is not limited thereto.

Figure 11:
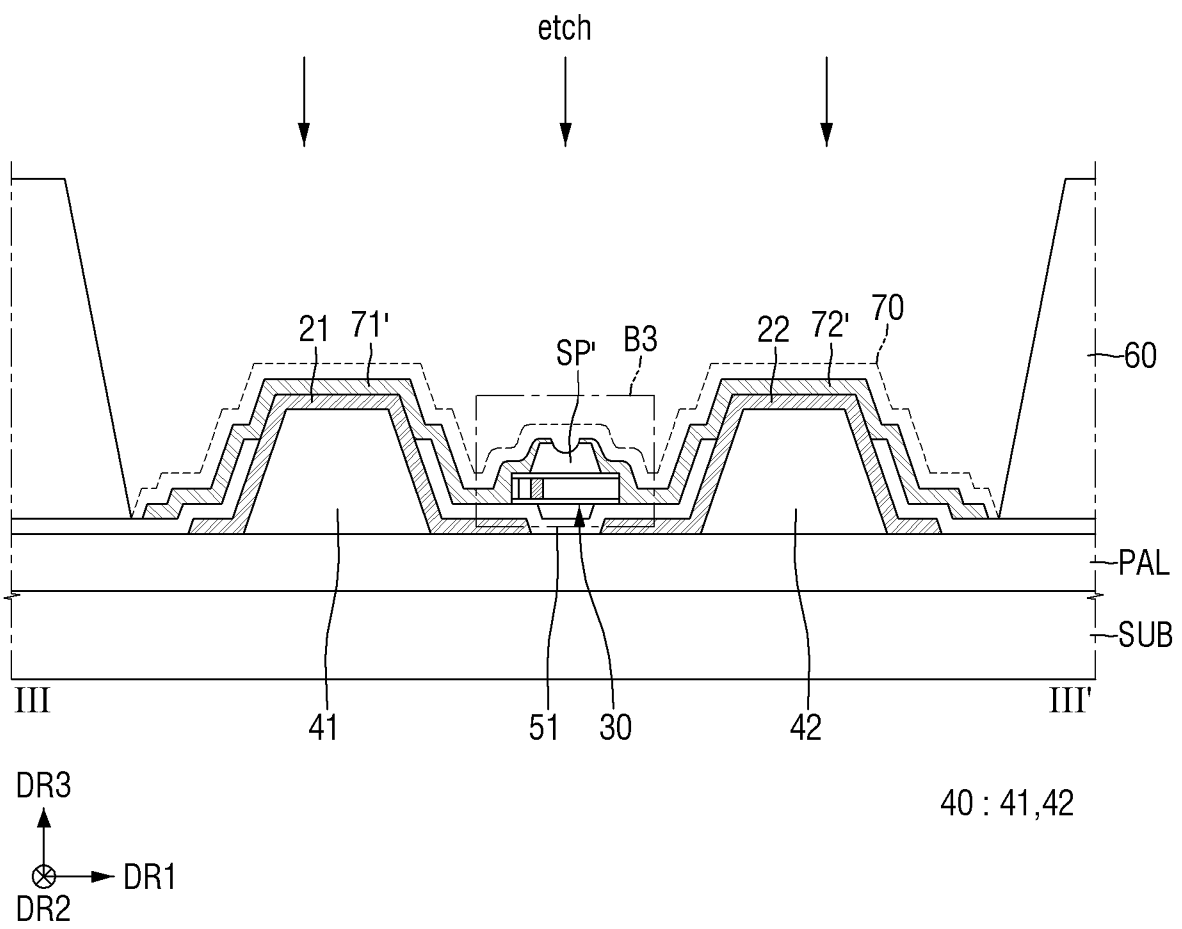
FIG. 11 is a schematic cross-sectional view illustrating a portion of a manufacturing process of a display apparatus of FIG. 3.
Figure 12:
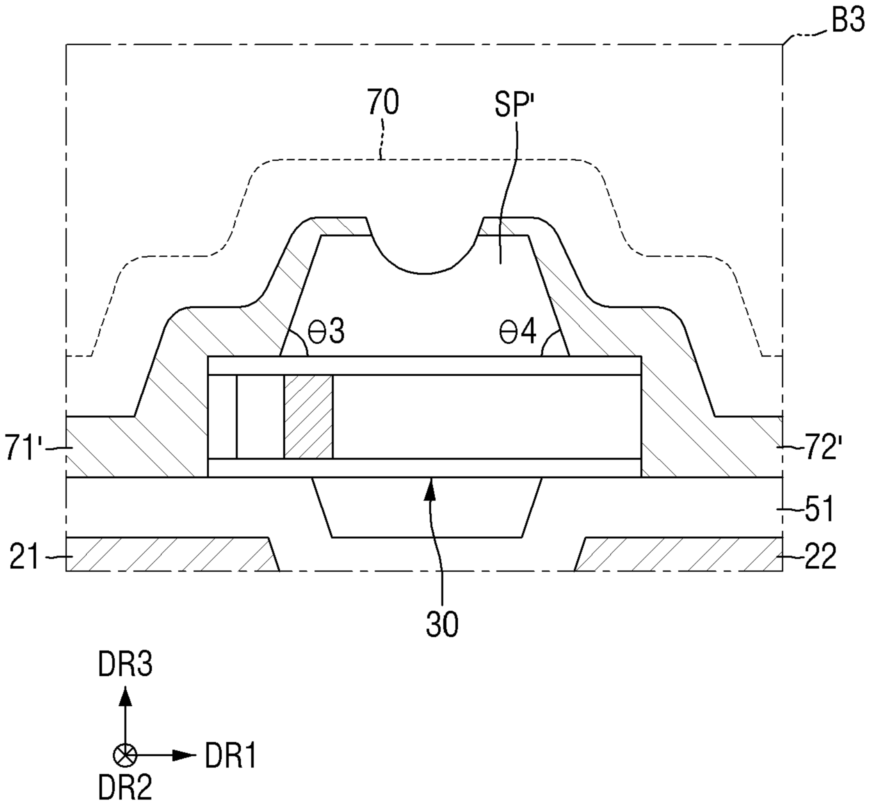
FIG. 12 is a schematic enlarged cross-sectional view of area B3 of FIG. 11.
Figure 13:
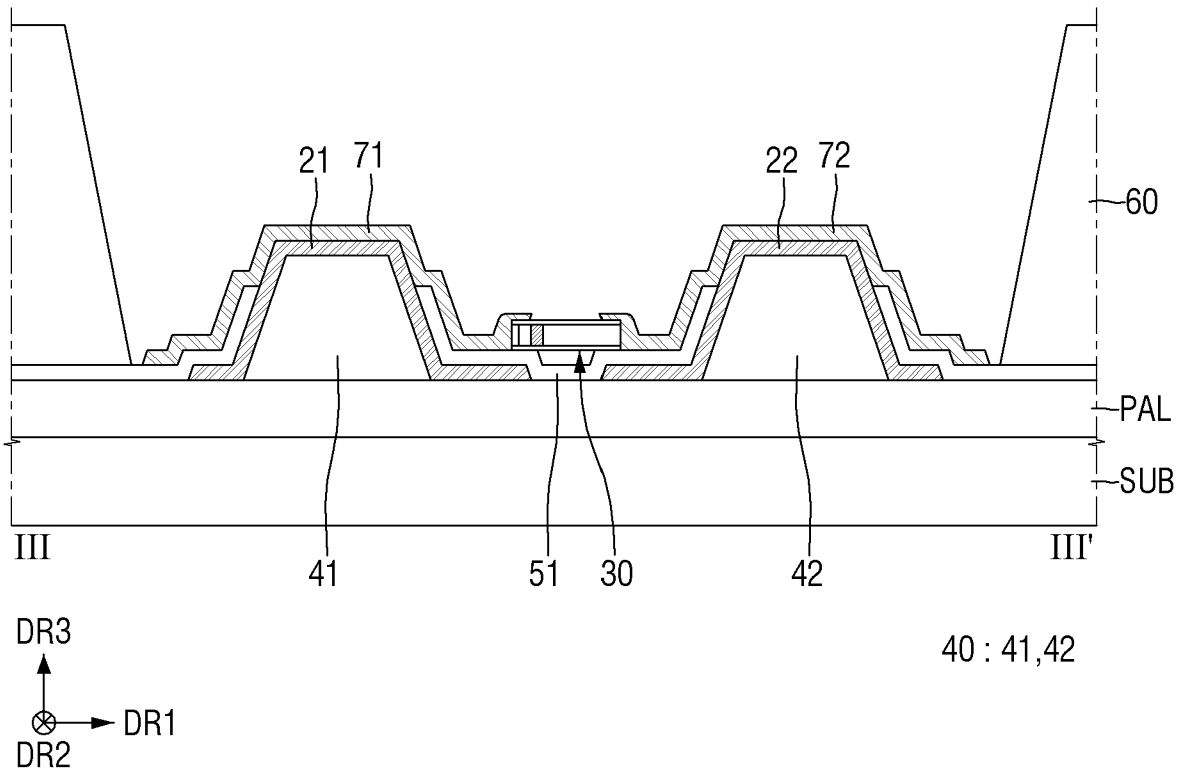
FIG. 13 is a schematic cross-sectional view illustrating a portion of a manufacturing process of a display apparatus of FIG. 3.

FIG. 11 is a schematic cross-sectional view illustrating a portion of a manufacturing process of a display apparatus of FIG. 3. FIG. 12 is a schematic enlarged cross-sectional view of area B3 of FIG. 11. FIG. 13 is a schematic cross-sectional view illustrating a portion of a manufacturing process of a display apparatus of FIG. 3.

Referring to FIGS. 11 to 13, the first and second contact electrodes 71 and 72 may be formed by removing a portion of the contact electrode layer 70 that overlaps the sacrificial pattern SP. The removing of the contact electrode layer 70 that overlaps the sacrificial pattern SP may be performed by front etching on the substrate SUB, on which the contact electrode layer 70 is formed, without a separate mask process. For example, the first and second contact electrodes 71 and 72 may be formed through a process such as an etch-back process on the substrate SUB on which the contact electrode layer 70 is formed.

For example, the front etching may be performed using a first etchant. An etching selectivity of the first etchant with the sacrificial pattern SP may be different from that of the first etchant with the contact electrode layer 70. In the embodiment, the etching selectivity of the first etchant with the sacrificial pattern SP may be greater than that of the first etchant with the contact electrode layer 70. In an embodiment, the etching selectivity of the first etchant with the sacrificial pattern SP may have a value of three times or more than the etching selectivity of the first etchant with the contact electrode layer 70. For example, in case that the contact electrode layer 70 includes ITO, the sacrificial pattern SP may include benzylaldehyde, chlorobenzene, tetrachloroethene, trichloroethene, etc.

While the contact electrode layer 70 is being etched by the first etchant, the thickness of the contact electrode layer 70 may be generally thinned. As shown in FIG. 12, the contact electrode layer 70 disposed on the sacrificial pattern SP that is the thinnest may be first removed so that the contact electrode layer 70 may be separated into a first area 71' and a second area 72'. The contact electrode layer 70 disposed on the sacrificial pattern SP may be first removed so that a sacrificial pattern SP' disposed therebelow may be exposed. Therefore, the sacrificial pattern SP' may be exposed by the contact electrode layer 70 and thus be etched by the first etchant. The sacrificial pattern SP having a higher etching selectivity with the first etchant may be removed as shown in FIG. 13, and patterned first and second contact electrodes 71 and 72 may be formed on the light emitting element 30. The structure of the first and second contact electrodes 71 and 72 has been described as above and thus its detailed description will be omitted. The second insulating layer 52 may be formed on the first and second contact electrodes 71 and 72 so that the display apparatus may be manufactured as shown in FIG. 3.

In the method of manufacturing the display apparatus according to the embodiment, the first and second contact electrodes 71 and 72 may be simultaneously formed using the sacrificial pattern SP without a separate mask process for forming the first and second contact electrodes 71 and 72, respectively. Therefore, the number of masks for forming the first and second contact electrodes 71 and 72 may be reduced, so that manufacturing process efficiency of the display apparatus may be improved. Also, since the etching selectivity of the first etchant, which is used in the etching process for forming the first and second contact electrodes 71 and 72, with the sacrificial pattern SP is greater than that of the first etchant with the contact electrode layer 70, the sacrificial pattern SP may be also removed in a same process. Therefore, since a separate process for removing the sacrificial pattern SP is not required, process efficiency may be improved.

Figure 14:
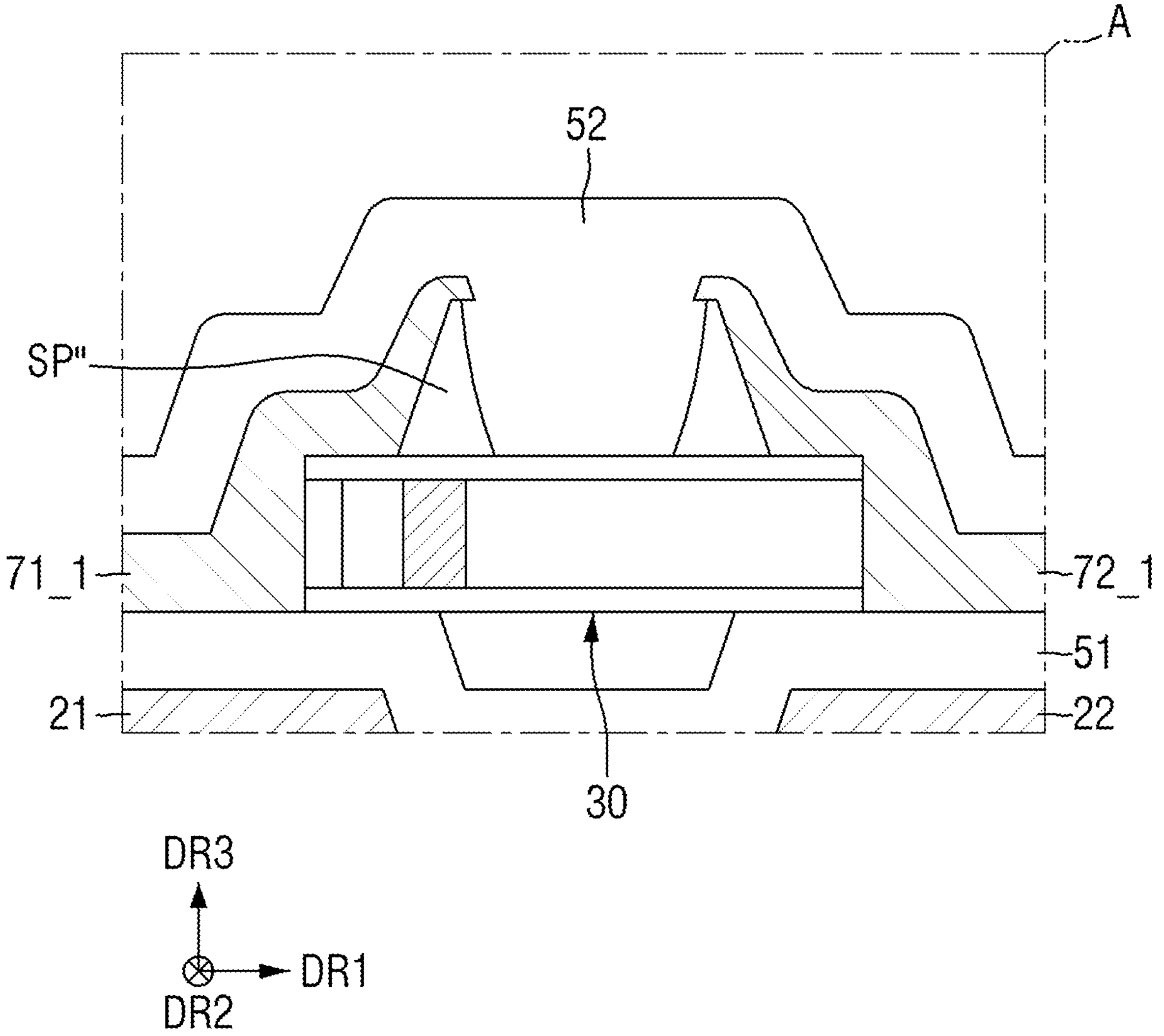
FIG. 14 is a schematic enlarged cross-sectional view of area A of FIG. 3 according to an embodiment.

FIG. 14 is a schematic enlarged cross-sectional view of area A of FIG. 3 according to an embodiment.

Referring to FIG. 14, in the embodiment, a first contact electrode 71_1 and a second contact electrode 72_1 may include areas protruding in a direction to a space which the first and second contact electrodes 71_1 and 72_1 face each other in an area where they are spaced apart from each other. For example, each of the first contact electrode 71_1 and the second contact electrode 72_1 may include a stepped space on the light emitting element 30. A second insulating layer 52 may be disposed in the stepped space of each of the first contact electrode 71_1 and the second contact electrode 72_1 on the light emitting element 30.

A sacrificial pattern residue SP" may remain in the space between the stepped area of the first contact electrode 71_1 disposed on the light emitting element 30 and the light emitting element 30. Likewise, the sacrificial pattern residue SP" may remain in the space between the stepped area of the second contact electrode 72_1 disposed on the light emitting element 30 and the light emitting element 30. The first and second contact electrodes 71_1 and 72_1 according to the embodiment may be formed as a portion of the contact electrode layer 70 disposed on the sacrificial pattern SP and the remaining sacrificial pattern residue SP" in case that an etching time is not sufficient during the etch-back process as shown in FIGS. 11 and 12.

FIG. 14 illustrates that the sacrificial pattern residue SP" remains in the space between the light emitting element 30 and each of the stepped areas of the first and second contact electrodes 71_1 and 72_1 disposed on the light emitting element 30, but the disclosure is not limited thereto. In some embodiments, the sacrificial pattern SP may be completely removed between the stepped area of each of the first and the second contact electrodes 71_1 and 72_1, which are disposed on the light emitting element 30, and the light emitting element 30, so that a material included in the second insulating layer 52 may be filled therebetween.

Hereinafter, another embodiment will be described. In the following embodiment, a redundant description of the same elements as those of the previously described embodiment will be omitted or simplified, and the description will be based on differences from the previously described embodiment.

Figure 15:
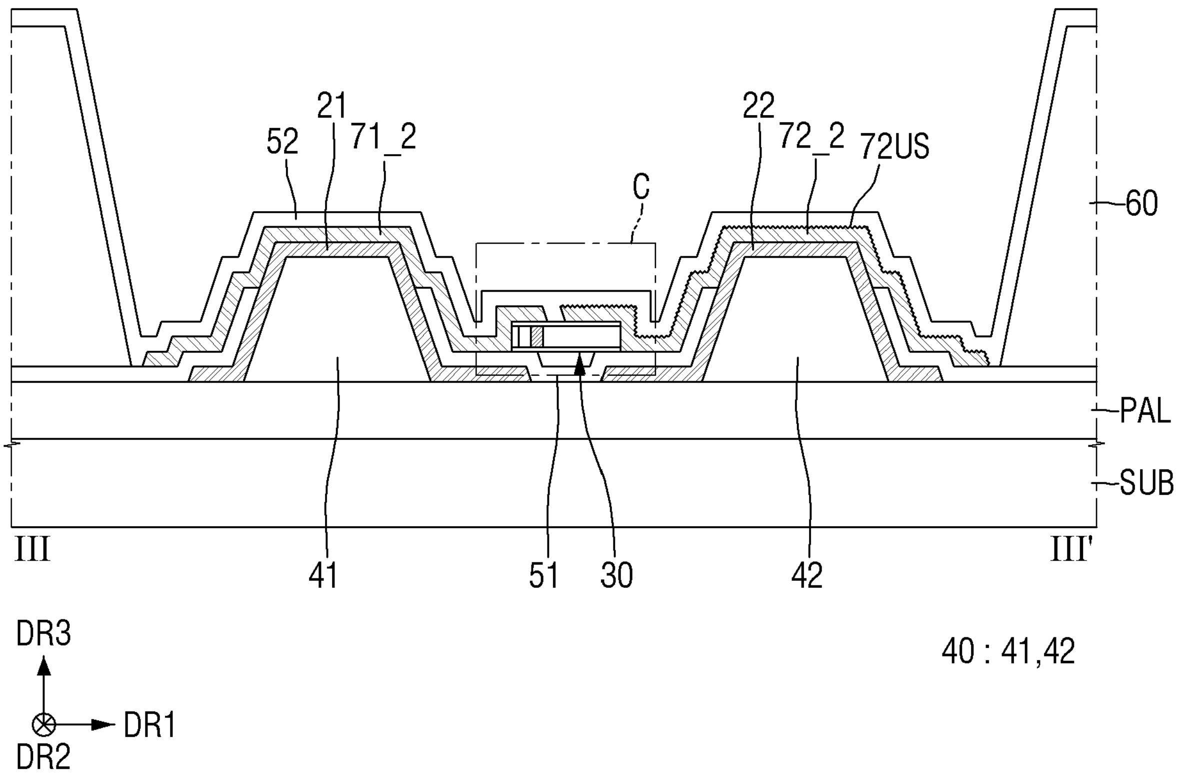
FIG. 15 is a schematic cross-sectional view taken along line III-III' of FIG. 2 according to an embodiment.
Figure 16:
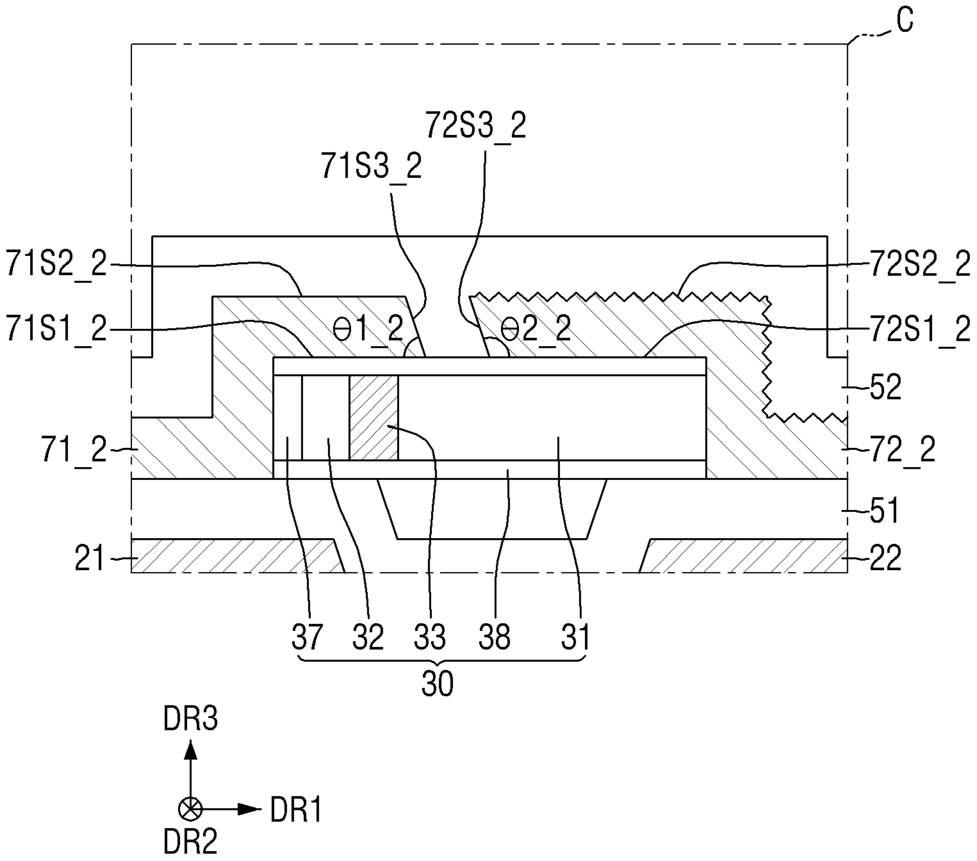
FIG. 16 is a schematic enlarged cross-sectional view of area C of FIG. 15 according to an embodiment.

FIG. 15 is a schematic cross-sectional view taken along line III-III' of FIG. 2 according to an embodiment. FIG. 16 is a schematic enlarged cross-sectional view of area C of FIG. 15 according to an embodiment.

Referring to FIGS. 15 and 16, the display apparatus according to the embodiment may be different from that of the embodiment of FIGS. 3 and 5 in that a cross-sectional shape of an end portion of a first contact electrode 71_2 includes a forward tapered shape, a cross-sectional shape of an end portion of a second contact electrode 72_2 includes a reverse tapered shape, and an upper surface 72US of the second contact electrode 72_2 has a surface roughness (e.g., a predetermined or selectable surface roughness).

For example, a cross-sectional shape of the first contact electrode 71_2 disposed on the light emitting element 30 may have a forward tapered shape. Therefore, a lower surface 71S1_2 of the first contact electrode 71_2 disposed on the light emitting element 30 may be more protruded than an upper surface 71S2_2 thereof, and a first taper angle θ1_2 formed by the lower surface 71S1_2 and a side 71S3_2 of the first contact electrode 71_2 may be an acute angle.

A cross-sectional shape of the second contact electrode 72_2 disposed on the light emitting element 30 may have a reverse tapered shape. Therefore, an upper surface 72S2_2 of the second contact electrode 72_2 disposed on the light emitting element 30 may be more protruded than a lower surface 72S1_2 thereof, and a second taper angle θ2_2 formed by the lower surface 72S1_2 and a side 72S3_2 of the second contact electrode 72_2 may be an obtuse angle.

The upper surface 72US of the second contact electrode 72_2 may have a surface roughness (e.g., a predetermined or selectable surface roughness). In the disclosure, 'surface roughness' may be defined as 'a surface (or uneven surface) on which a fine uneven pattern is formed', and the 'fine uneven pattern' may include both 'an uneven pattern having a specific pattern' and 'a random uneven pattern'. For example, 'a surface having a surface roughness' may mean 'a non-flat surface'. The surface roughness may be entirely formed on the upper surface 72US of the second contact electrode 72_2, but the disclosure is not limited thereto. An area of the upper surface 72US of the second contact electrode 72_2 may have a flat surface, and another area of the upper surface 72US of the second contact electrode 72_2 may have a surface roughness.

The surface roughness formed on the upper surface 72US of the second contact electrode 72_2 may be formed in a process for forming the second contact electrode 72_2 during a manufacturing process of the display apparatus, which will be described below. The upper surface 72US of the second contact electrode 72_2 may be formed to have an increased surface roughness by damaging a portion of the upper surface during the manufacturing process of the display apparatus. Therefore, the surface roughness formed on the upper surface 72US of the second contact electrode 72_2 may be randomly formed without having a pattern on an entire surface of the upper surface 72US of the second contact electrode 72_2.

Hereinafter, a manufacturing process of the display apparatus of FIG. 15 will be described.

FIGS. 17 to 22 are schematic cross-sectional views illustrating a manufacturing process of a display apparatus of FIG. 15.

Figure 17:
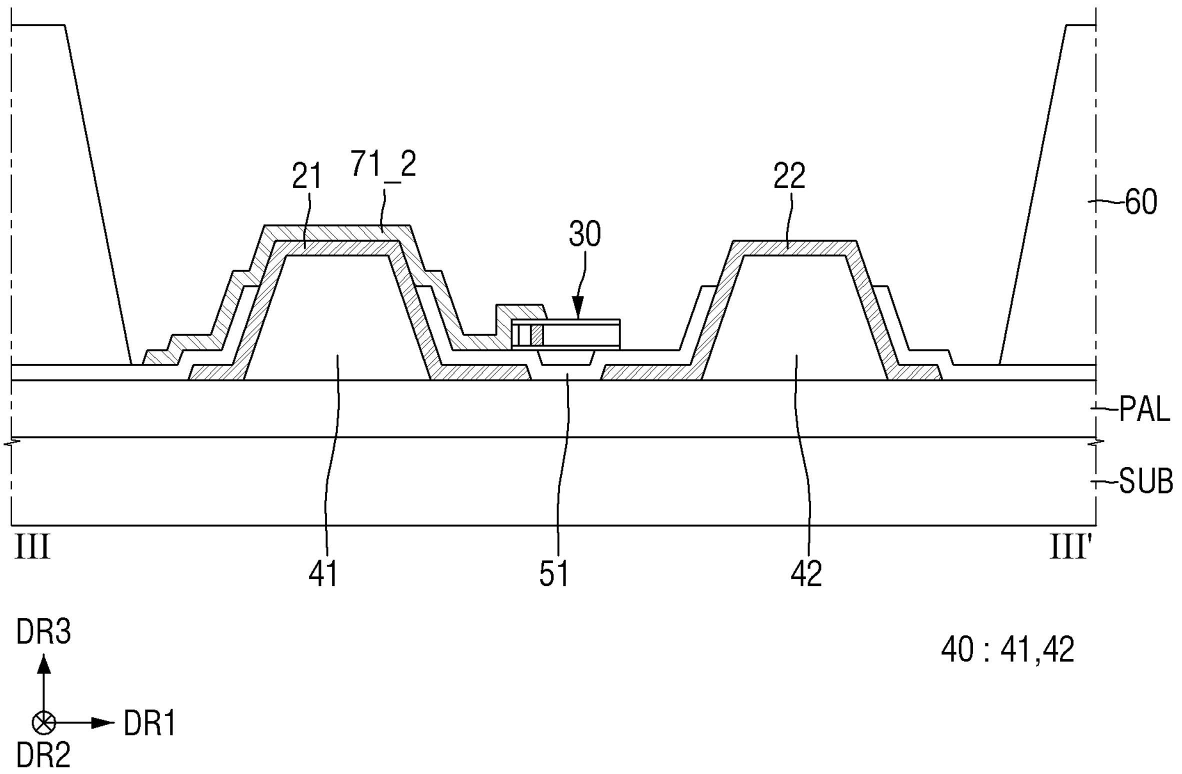
FIGS. 17 to 22 are schematic cross-sectional views illustrating a manufacturing process of a display apparatus of FIG. 15.

Referring to FIG. 17, a patterned first contact electrode 71_2 may be formed on the light emitting element 30. The patterned first contact electrode 71_2 may be formed by a mask process. For example, a first contact electrode layer may be entirely deposited on the substrate SUB. A photoresist layer may be coated on the first contact electrode layer, and a photoresist pattern, which has a pattern shape of the first contact electrode 71_2 and should remain, may be formed through exposure and development. The first contact electrode layer may be etched using the photoresist pattern as an etching mask, so that the first contact electrode 71_2 is formed as shown in FIG. 17.

Figure 18:
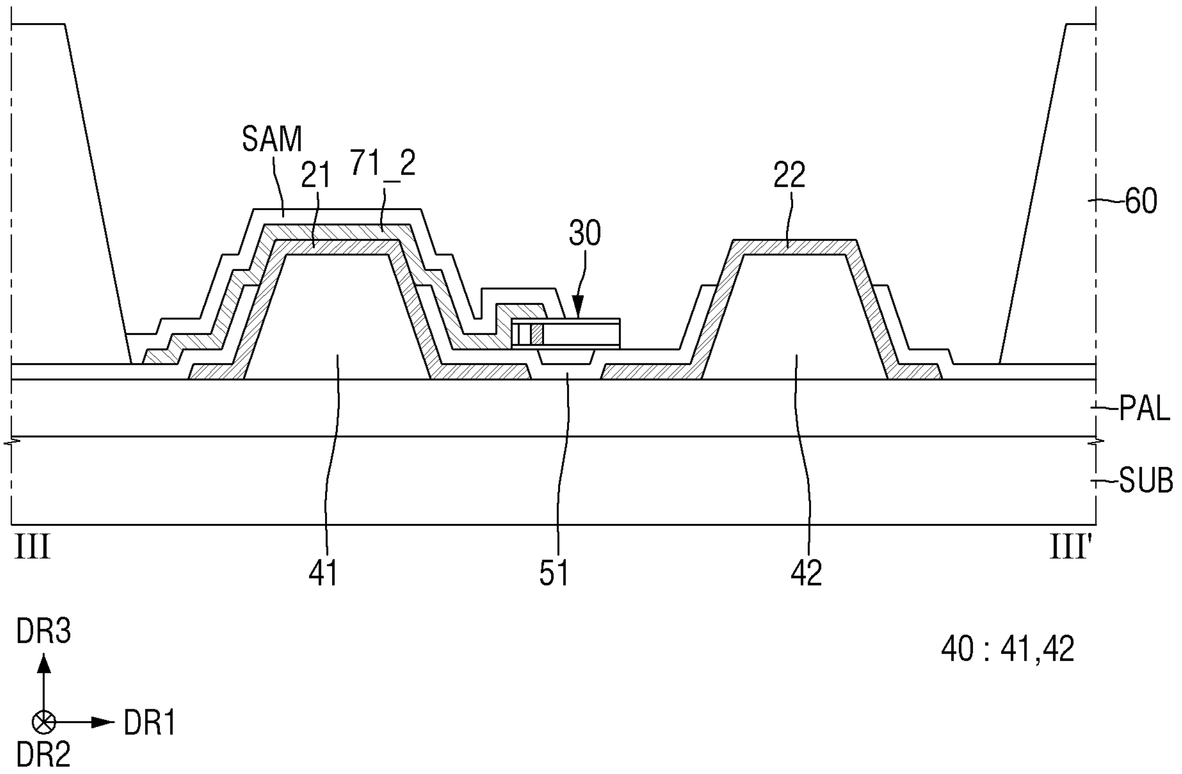

Referring to FIG. 18, a sacrificial pattern may be formed on the first contact electrode 71_2. In the embodiment, the sacrificial pattern may include a self-assembled monolayer SAM. The self-assembled monolayer SAM may be formed on the first contact electrode 71_2 to completely cover the first contact electrode 71_2. The self-assembled monolayer SAM may be formed by a coating method, a printing method, a deposition method, or the like.

The self-assembled monolayer SAM may be an organic assembly formed by adsorbing organic molecules, which are present in a solution or a gas phase, each other, and may be spontaneously aligned to form a crystal structure. The self-assembled monolayer SAM may have a film which has a thickness of several nano-meters (nm), and thus be very thin and uniform. Therefore, the self-assembled monolayer SAM may be used to readily control the first contact electrode 71_2 and the second contact electrode 72_2 such that the first contact electrode 71_2 and the second contact electrode 72_2 are spaced apart from each other on the light emitting element 30 having a size of nano to micro meter scale. The self-assembled monolayer SAM may include octadecyl trichlorosilane, fluoroalkyl trichlorosilane, perfluoroalkyl triethoxysilane, etc.

Figure 19:
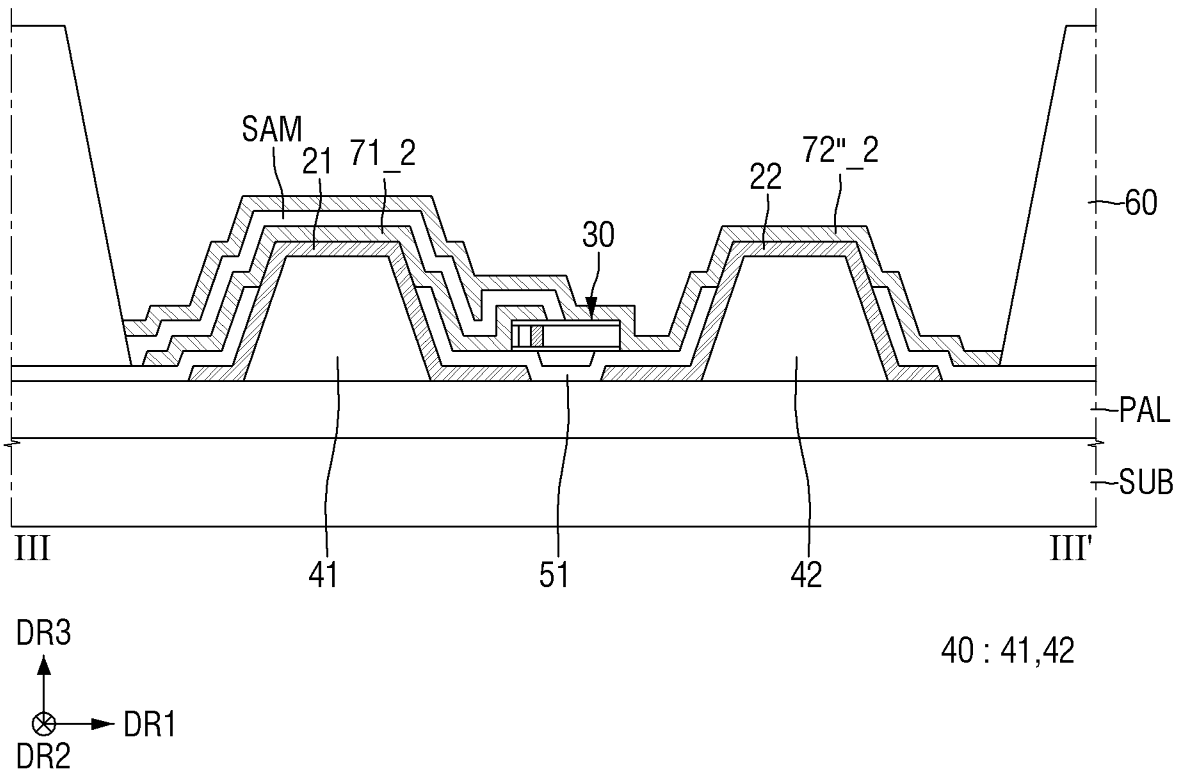
Figure 20:
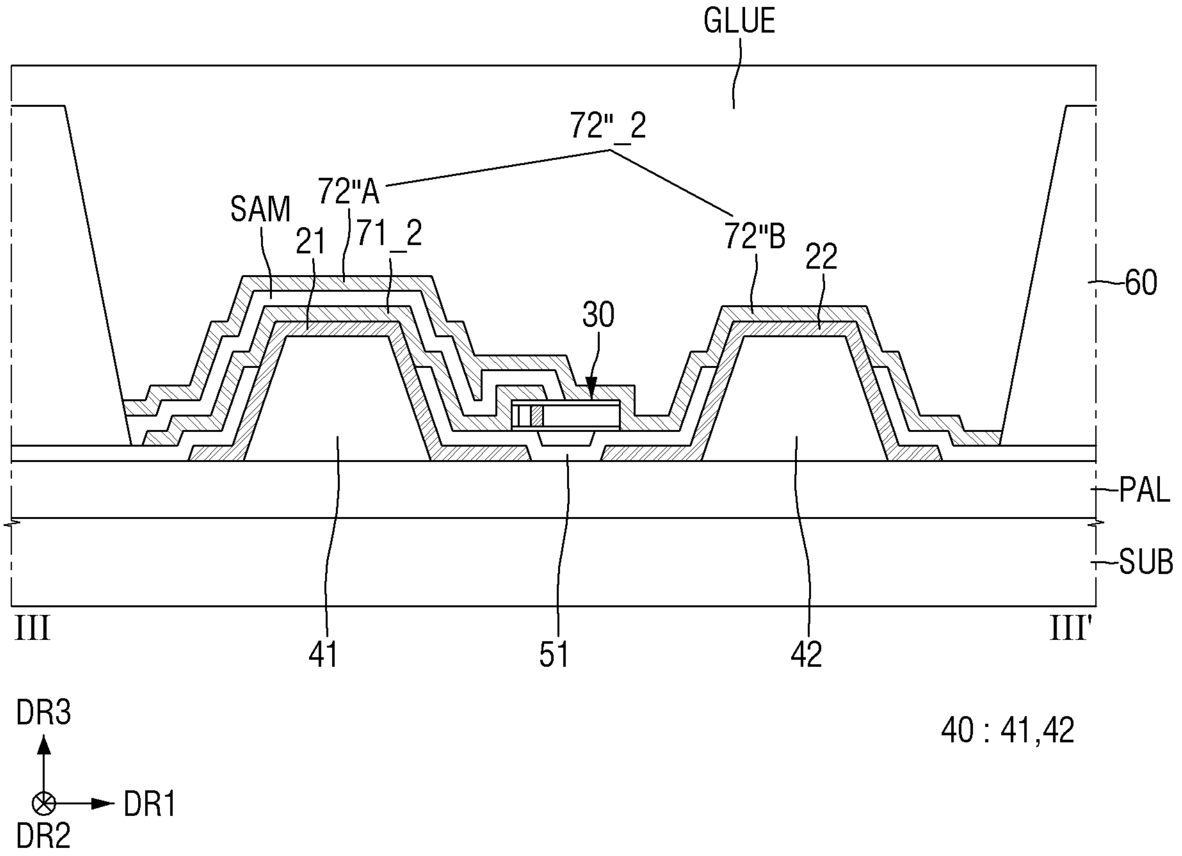

Referring to FIG. 19, a second contact electrode layer 72"_2 may be entirely deposited on the substrate SUB on which the self-assembled monolayer SAM is formed. As shown in FIG. 20, a glue layer GLUE may be formed on the substrate SUB. A surface of the glue layer GLUE that faces (or contacts) the second contact electrode layer 72"_2 may have an adhesive force. The glue layer GLUE having the adhesive force may be attached to the second contact electrode layer 72"_2 to remove an area of the second contact electrode layer 72"_2.

For example, referring to FIG. 20, the second contact electrode layer 72"_2 may include a first area 72"A disposed in an area overlapping the self-assembled monolayer SAM in the third direction DR3 and a second area 72"B disposed in an area that does not overlap the self-assembled monolayer SAM in the third direction DR3.

Figure 21:
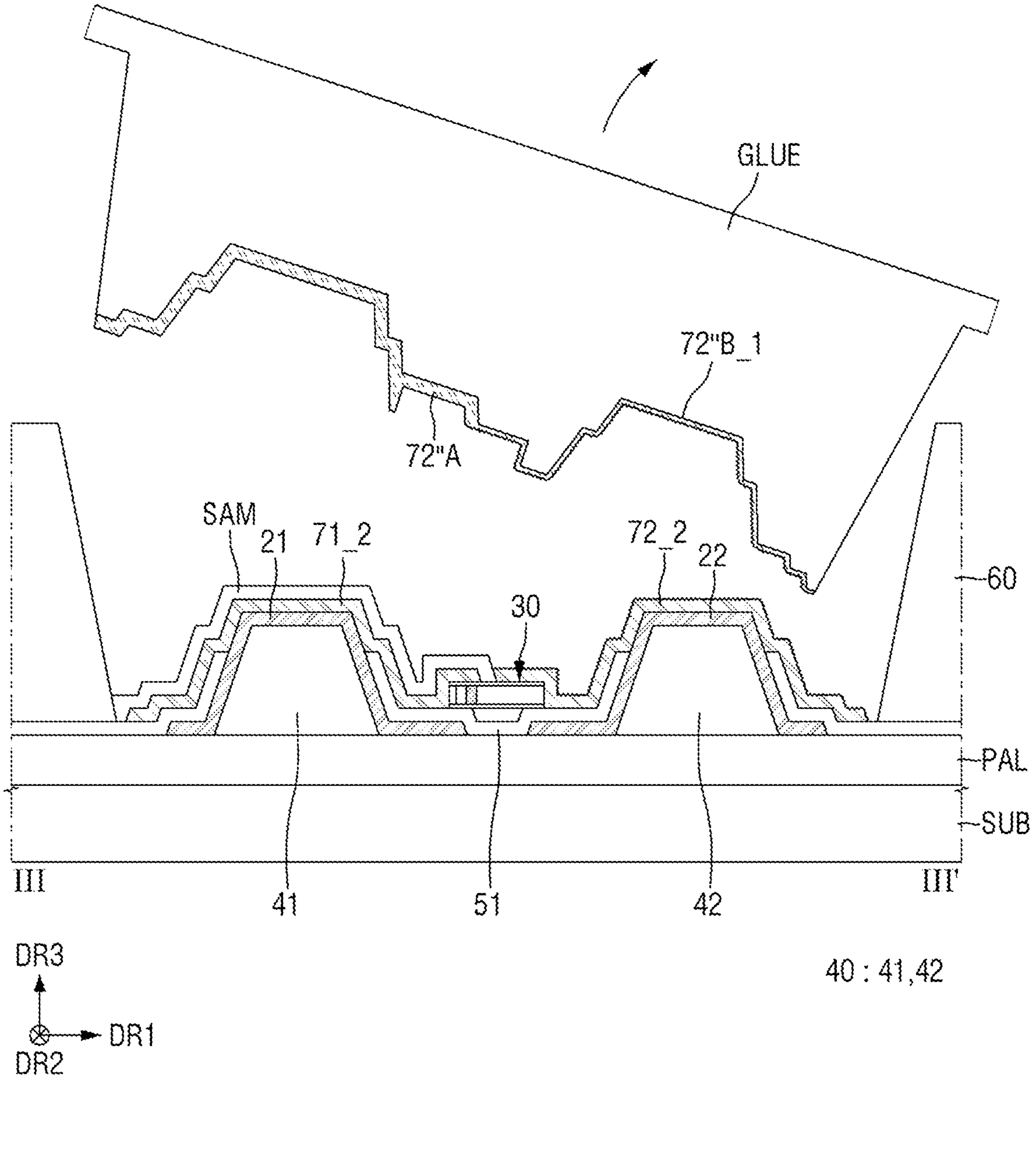

Referring to FIGS. 20 and 21, the second contact electrode 72_2 may be formed by removing the glue layer GLUE through a lift-off process. A first area 72"A of the second contact electrode layer 72"_2 disposed in the area overlapping the self-assembled monolayer SAM in the third direction DR3 may be removed by being attached to the glue layer GLUE, and a portion of the second area 72"B of the second contact electrode layer 72"_2 may remain on the substrate SUB. However, in the removing of the glue layer GLUE, a portion of an upper surface of the second area 72"B of the second contact electrode layer 72"2 may be attached to a surface of the glue layer GLUE and thus remain as a residue 72"B_1. For example, in the process of forming the second contact electrode 72_2 by removing the glue layer GLUE through the lift-off process, the first area 72"A of the second contact electrode layer 72"_2 may be removed from the substrate SUB by being attached to the glue layer GLUE, and a surface of the second area 72"B of the second contact electrode layer 72"_2 may be partially torn by the adhesive force of the glue layer GLUE so that a portion of the surface of the second area 72"B may be removed by being attached to the glue layer GLUE as the residue 72"B_1 and another portion thereof may remain on the substrate SUB to form the second contact electrode 72_2, of which an upper surface has a surface roughness (e.g., a predetermined or selectable surface roughness), as shown in FIG. 21.

Figure 22:
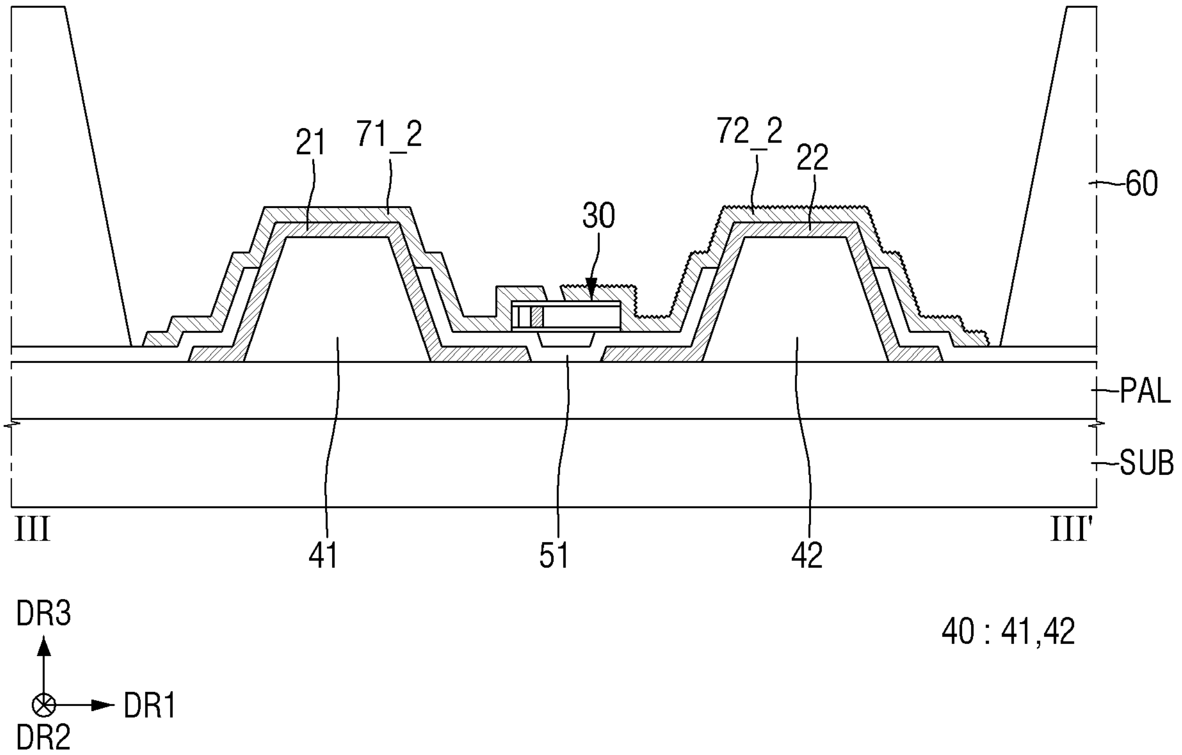

Referring to FIG. 22, the self-assembled monolayer SAM may be removed. The self-assembled monolayer SAM may be removed by an etching process. The second insulating layer 52 may be formed on the entire surface of the substrate SUB so that the display apparatus may be manufactured as shown in FIG. 15.

Figure 23:
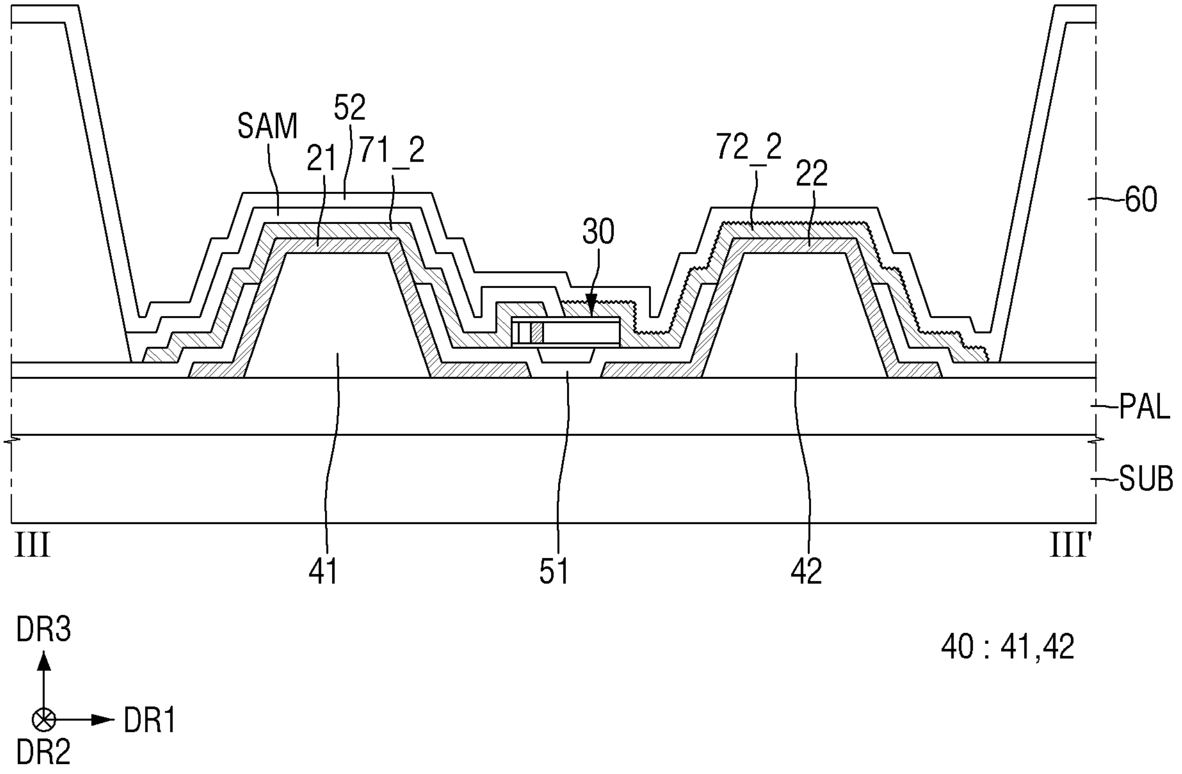
FIG. 23 is a schematic cross-sectional view taken along line III-III' of FIG. 2 according to an embodiment.

FIG. 23 is a schematic cross-sectional view taken along line III-III' of FIG. 2 according to an embodiment.

Referring to FIG. 23, the display apparatus according to the embodiment may be different from that of the embodiment of FIG. 15 in that a self-assembled monolayer SAM is further disposed on the first contact electrode 71_2.

For example, the self-assembled monolayer SAM may be disposed on the first contact electrode 71_2. The self-assembled monolayer SAM may be disposed between the first contact electrode 71_2 and the second contact electrode 72_2 on the light emitting element 30. The second insulating layer 52 may be disposed on the self-assembled monolayer SAM. After the process of forming the second contact electrode 72_2 is performed, the display apparatus according to the embodiment may be manufactured by forming the second insulating layer 52 without a separate process of removing the self-assembled monolayer SAM. Since the separate process for removing the self-assembled monolayer SAM may be omitted, efficiency in the manufacturing process of the display apparatus may be increased.

Figure 24:
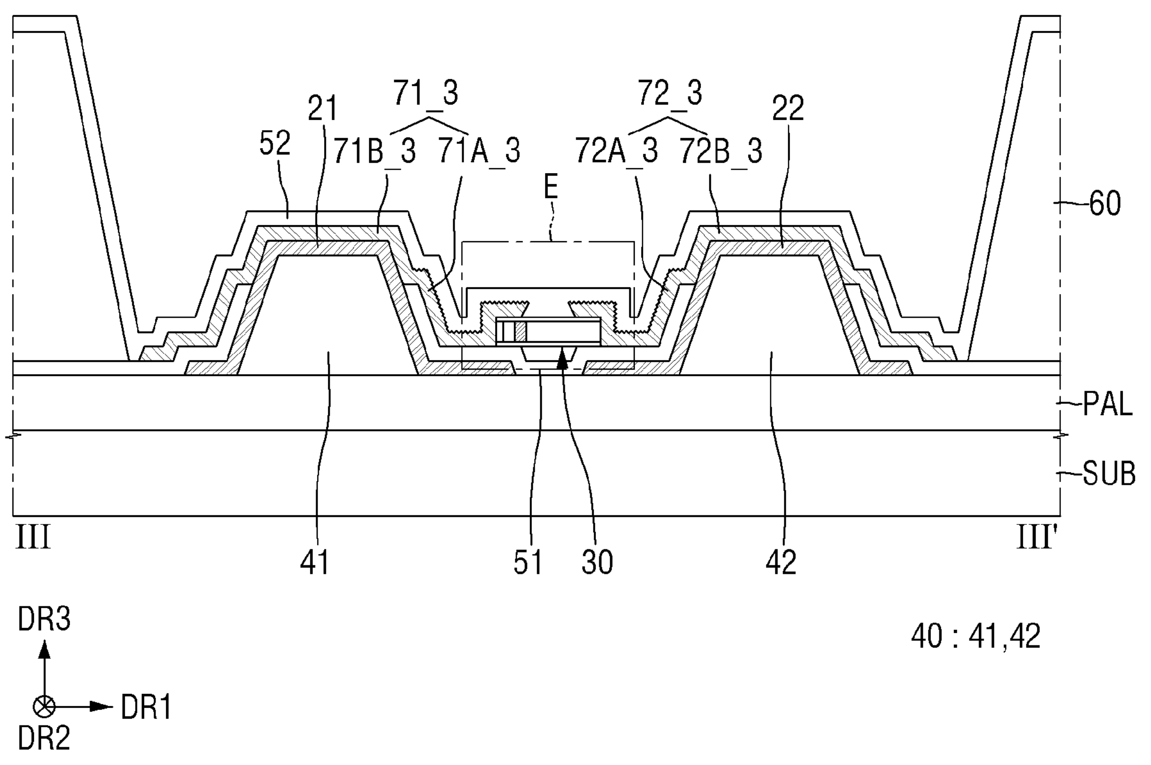
FIG. 24 is a schematic cross-sectional view taken along line III-III' of FIG. 2 according to an embodiment.
Figure 25:
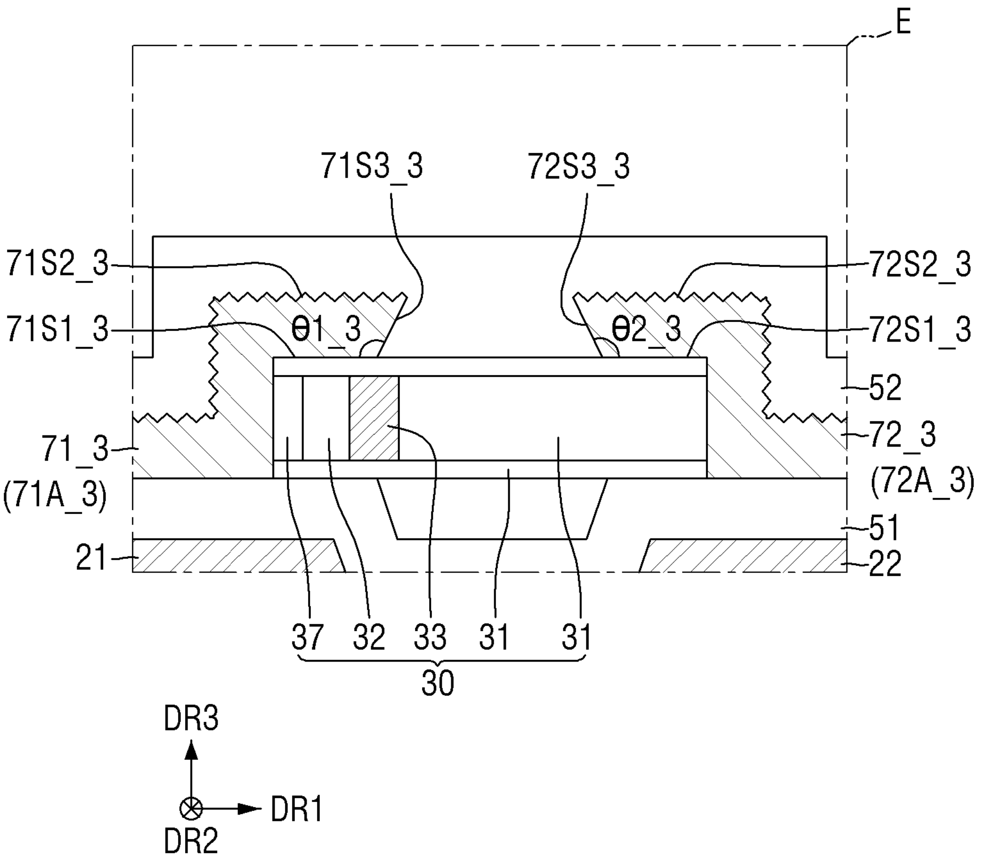
FIG. 25 is a schematic enlarged cross-sectional view of area E of FIG. 24.

FIG. 24 is a schematic cross-sectional view taken along line III-III' of FIG. 2 according to an embodiment. FIG. 25 is a schematic enlarged cross-sectional view of area E of FIG. 24.

Referring to FIG. 24, the embodiment may be different from the embodiment of FIG. 3 in that each of a first contact electrode 71_3 and a second contact electrode 72_3 has a surface roughness formed on an upper surface thereof in an area adjacent to the light emitting element 30.

For example, the first contact electrode 71_3 may include a first area 71A_3 on which a surface roughness is formed, and a second area 71B_3 on which no surface roughness is formed (for example, the second area 71B_3 having a flat surface). The first area 71A_3 may be positioned adjacent to the light emitting element 30, and the second area 71B_3 may be positioned between the first area 71A_3 and the second bank 60.

Likewise, the second contact electrode 72_3 may include a first area 72A_3 on which a surface roughness is formed, and a second area 72B_3 on which no surface roughness is formed (for example, the second area 72B_3 having a flat surface). The first area 72A_3 may be positioned adjacent to the light emitting element 30, and the second area 72B_3 may be positioned between the first area 72A_3 and the second bank 60.

The first contact electrode 71_3 and the second contact electrode 72_3 may have a surface roughness formed on upper surfaces of end portions thereof facing each other. For example, a surface roughness (e.g., a predetermined or selectable surface roughness) may be formed on the upper surfaces of the first contact electrode 71_3 and the second contact electrode 72_3, which are disposed in the area adjacent to the light emitting element 30. The surface roughness may be formed in a process for forming the first contact electrode 71_3 and the second contact electrode 72_3 during the manufacturing process of the display apparatus. FIG. 25 illustrates that the surface roughness is formed only on the upper surfaces 71S2_3 and 72S2_3 of the first contact electrode 71_3 and the second contact electrode 72_3 disposed in the area adjacent to the light emitting element 30, but the disclosure is not limited thereto. For example, the surface roughness may be entirely formed on the upper surfaces of the first contact electrode 71_3 and the second contact electrode 72_3.

A cross-sectional shape of each of an end portion of the first contact electrode 71_3 and an end portion of the second contact electrode 72_3 of the embodiment may have a reverse tapered shape. For example, referring to FIG. 25, an angle formed by a lower surface 71S1_3 and a side 71S3_3 of the first area 71A_3 of the first contact electrode 71_3 disposed on the light emitting element 30 may be an obtuse angle. In an embodiment, a first taper angle θ1_3 formed by the lower surface 71S1_3 and the side 71S3_3 of the first area 71A_3 of the first contact electrode 71_3 may be greater than about 90° and smaller than or equal to about 145°, but the disclosure is not limited thereto. The cross-sectional shape of an end portion of the first contact electrode 71_3 may have a forward tapered shape. Likewise, an angle formed by a lower surface 72S1_3 and a side 72S3_3 of the second contact electrode 72_3 disposed on the light emitting element 30 may be an obtuse angle. In an embodiment, a second taper angle θ2_3 formed by the lower surface 72S1_3 and the side 72S3_3 of the first area 72A_3 of the second contact electrode 72_3 may be greater than about 90° and smaller than or equal to about 145°, but the disclosure is not limited thereto. The cross-sectional shape of an end portion of the second contact electrode 72_3 may have a forward tapered shape.

Hereinafter, a manufacturing process of the display apparatus of FIG. 24 will be described.

Figure 26:
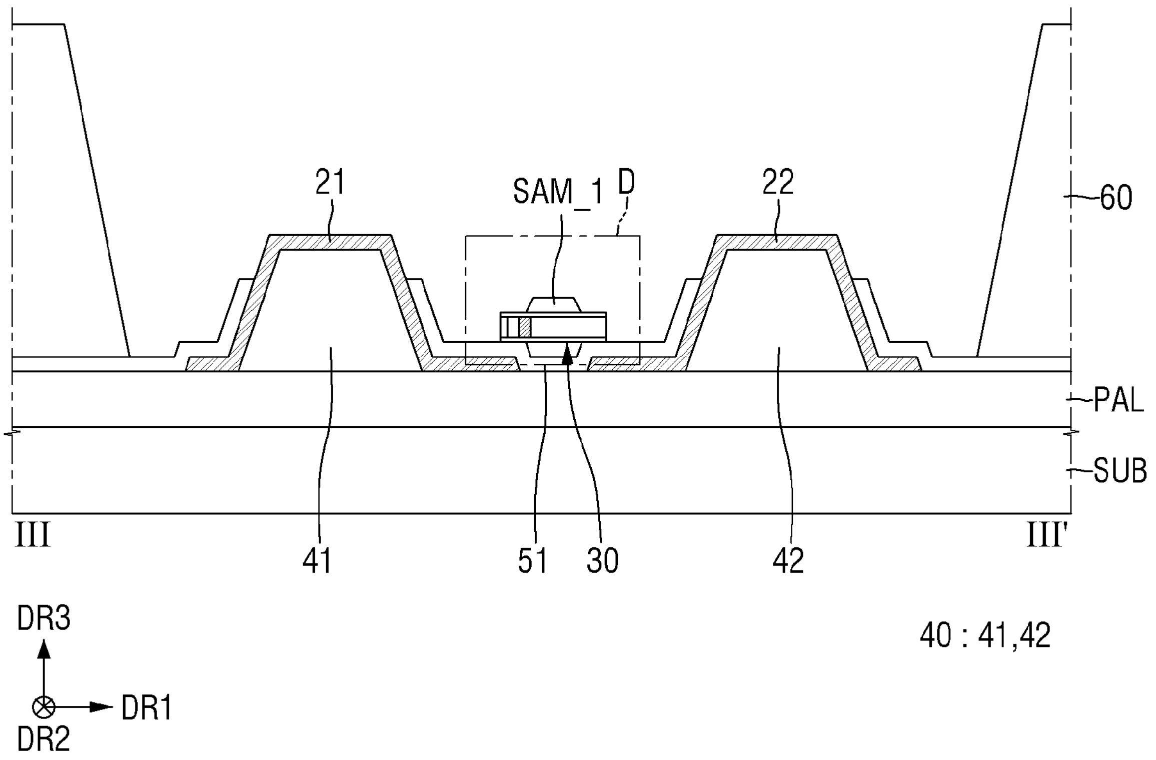
FIG. 26 is a schematic cross-sectional view illustrating a portion of a manufacturing process of a display apparatus of FIG. 24.
Figure 27:
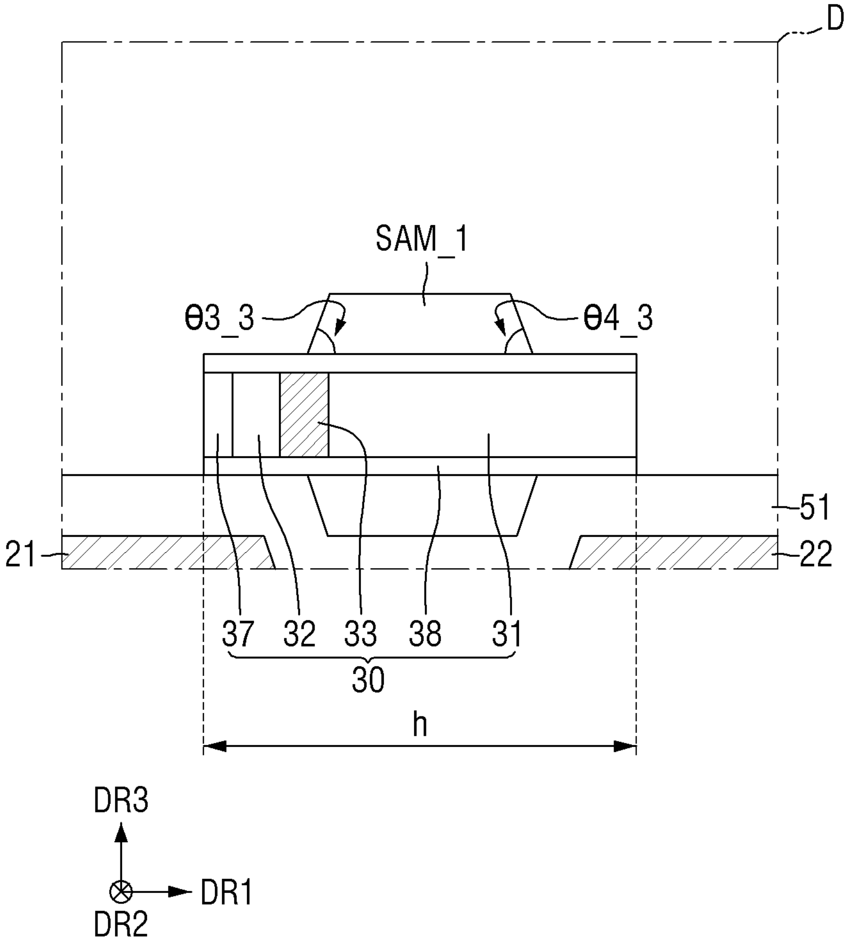
FIG. 27 is a schematic enlarged cross-sectional view of area D of FIG. 26.

FIG. 26 is a schematic cross-sectional view illustrating a portion of a manufacturing process of a display apparatus of FIG. 24. FIG. 27 is a schematic enlarged cross-sectional view of area D of FIG. 26.

Referring to FIGS. 26 and 27, a self-assembled monolayer SAM_1 may be formed on the light emitting element 30. The self-assembled monolayer SAM_1 formed on the light emitting element 30 may expose ends of the light emitting element 30. A cross-sectional shape of the self-assembled monolayer SAM_1 may be substantially the same as the cross-sectional shape of the sacrificial pattern SP described above. For example, the cross-sectional shape of the self-assembled monolayer SAM_1 may include a forward tapered shape. A third taper angle θ3_3 of the self-assembled monolayer SAM_1 may be a supplementary angle to the first taper angle θ1_3 of the first contact electrode 71_3. A fourth taper angle θ4_3 of the self-assembled monolayer SAM_1 may be a supplementary angle to the second taper angle θ2_3 of the second contact electrode 72_3.

FIGS. 28 to 31 are schematic cross-sectional views illustrating a portion of a manufacturing process of a display apparatus of FIG. 24.

Figure 28:
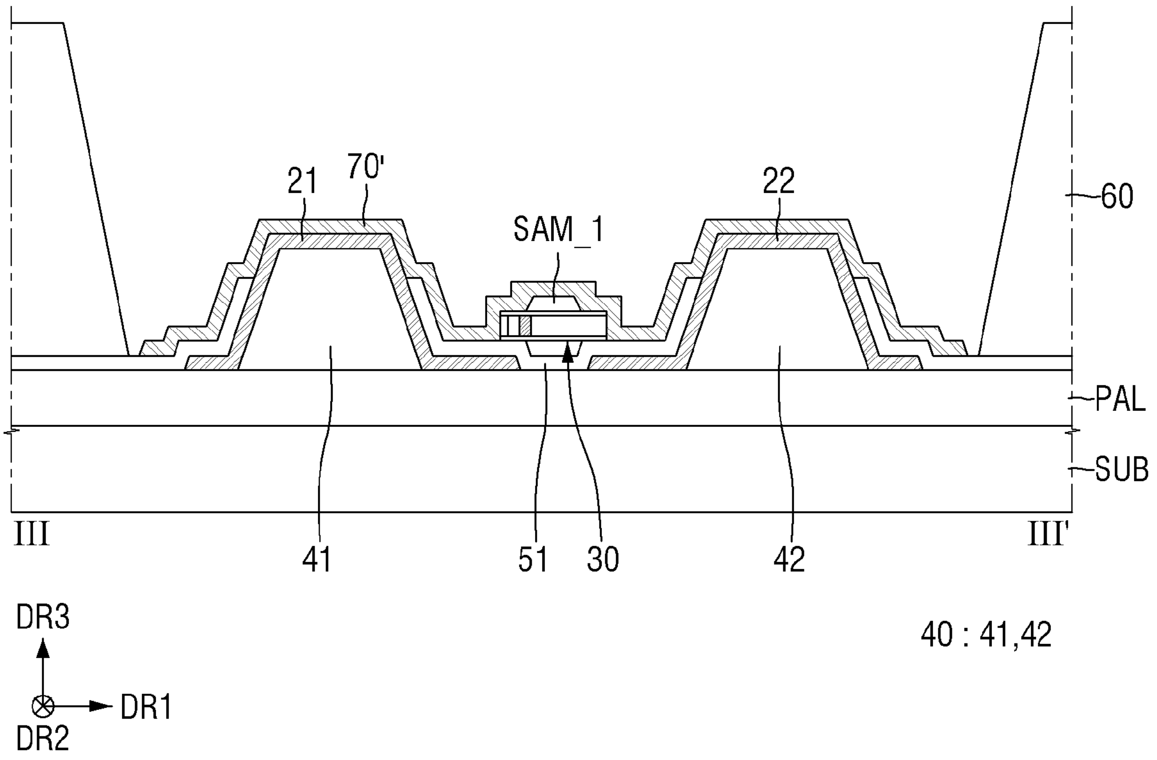
FIGS. 28 to 31 are schematic cross-sectional views illustrating a portion of a manufacturing process of a display apparatus of FIG. 24.

Referring to FIG. 28, a contact electrode layer 70' may be entirely deposited on the substrate SUB in which the self-assembled monolayer SAM_1 is formed. The contact electrode layer 70' may be disposed on the self-assembled monolayer SAM_1 and ends of the light emitting element 30 exposed by the self-assembled monolayer SAM_1. The contact electrode layer 70' may be extended outward to be disposed on the first and second electrodes 21 and 22 and the first insulating layer 51.

Figure 29:
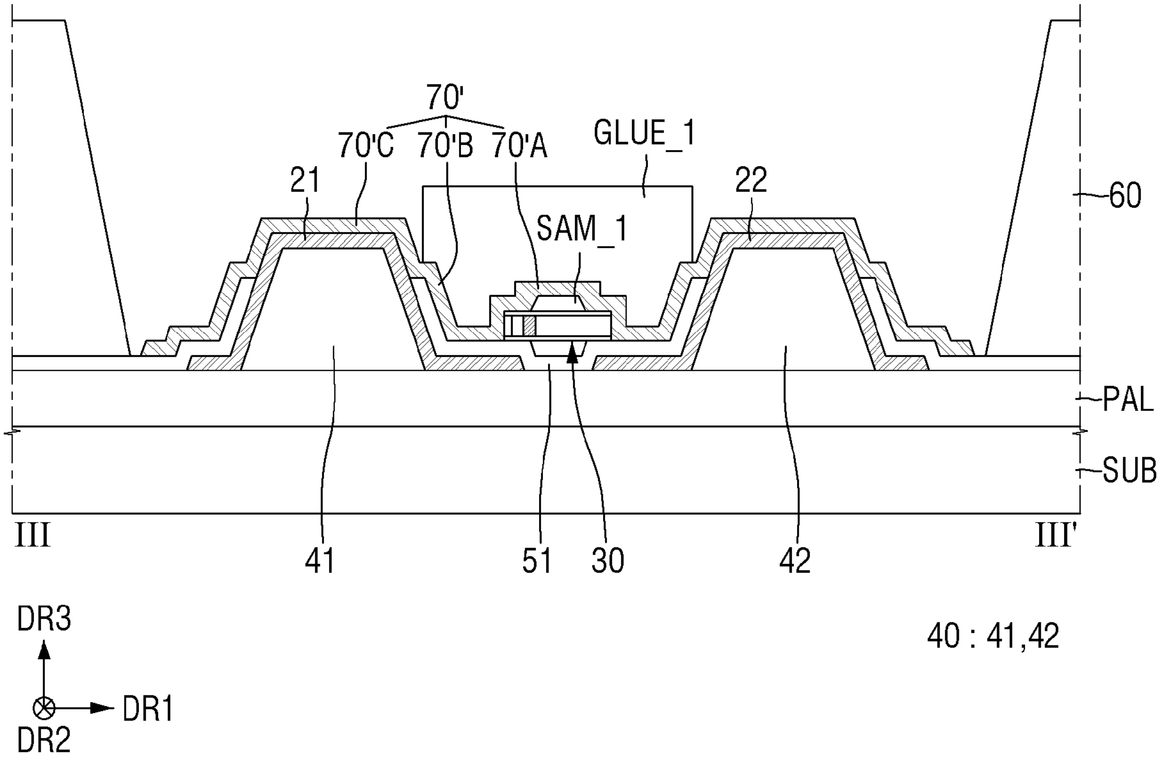

Referring to FIG. 29, a glue layer GLUE_1 may be formed on the contact electrode layer 70' in an area between the first sub bank 41 and the second sub bank 42. A surface of the glue layer GLUE_1 may contact the contact electrode layer 70' disposed between the first sub bank 41 and the second sub bank 42.

The contact electrode layer 70' may include a first area 70'A, a second area 70'B, and a third area 70'C based on a relative arrangement relation with the self-assembled monolayer SAM_1 and the glue layer GLUE_1.

The first area 70'A of the contact electrode layer 70' may be an area overlapping the self-assembled monolayer SAM_1 and the glue layer GLUE_1 in the third direction DR3. The second area 70'B of the contact electrode layer 70' may be an area that overlaps the glue layer GLUE_1 in the third direction DR3 but does not overlap the self-assembled monolayer SAM_1 in the third direction DR3. The third area 70'C of the contact electrode layer 70' may be an area that does not overlap the glue layer GLUE_1 and the self-assembled monolayer SAM_1 in the third direction DR3.

FIG. 29 illustrates that the glue layer GLUE_1 is formed only in an area of the contact electrode layer 70' in the area between the first sub bank 41 and the second sub bank 42, but the disclosure is not limited thereto. For example, the glue layer GLUE_1 may be entirely formed on the substrate SUB.

Figure 30:
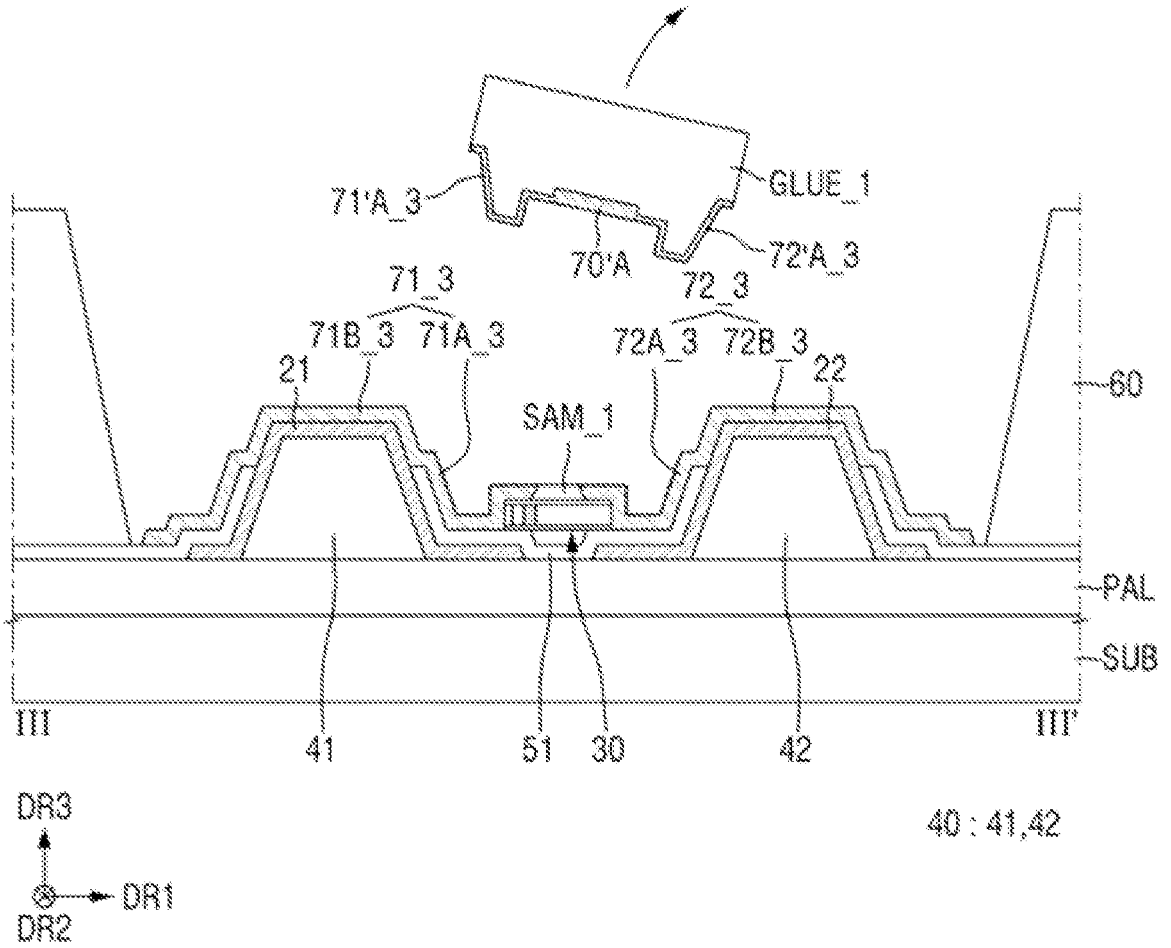

Referring to FIGS. 29 and 30, a first contact electrode 71_3 and a second contact electrode 72_3 may be formed by removing the glue layer GLUE_1 through a lift-off process.

As the glue layer GLUE_1 is removed, the first area 70'A of the contact electrode layer 70' overlapping the self-assembled monolayer SAM_1 and the glue layer GLUE_1 in the third direction DR3 may be removed by being attached to a surface of the glue layer GLUE_1.

The second area 70'B of the contact electrode layer 70' may remain on the substrate SUB. However, in the removing of the glue layer GLUE_1, a portion of an upper surface of the second area 70'B of the contact electrode layer 70' may be attached to a surface of the glue layer GLUE_1 to remain as residues 71'A_3 and 72'A_3. For example, a surface of the second area 70'B of the contact electrode layer 70' may be partially torn by an adhesive force of the glue layer GLUE_1 so that a portion of the surface of the second area 70'B may be removed by being attached to the glue layer GLUE_1 as the residues 71'A_3 and 72'A_3 and another portion thereof may remain on the substrate SUB to form the first area 71A_3 of the first contact electrode 71_3 and the first area 72A_3 of the second contact electrode 72_3, on which a surface roughness (e.g., a predetermined or selectable surface roughness) is formed, as shown in FIG. 30.

The third area 70'C of the contact electrode layer 70' may remain on the substrate SUB. The second area 71B_3 of the first contact electrode 71_3 and the second area 72B_3 of the second contact electrode 72_3, which correspond to the third area 70'C of the contact electrode layer 70' that does not overlap the glue layer GLUE_1 and the self-assembled monolayer SAM_1 in the third direction DR3, may have a flat upper surface.

Figure 31:
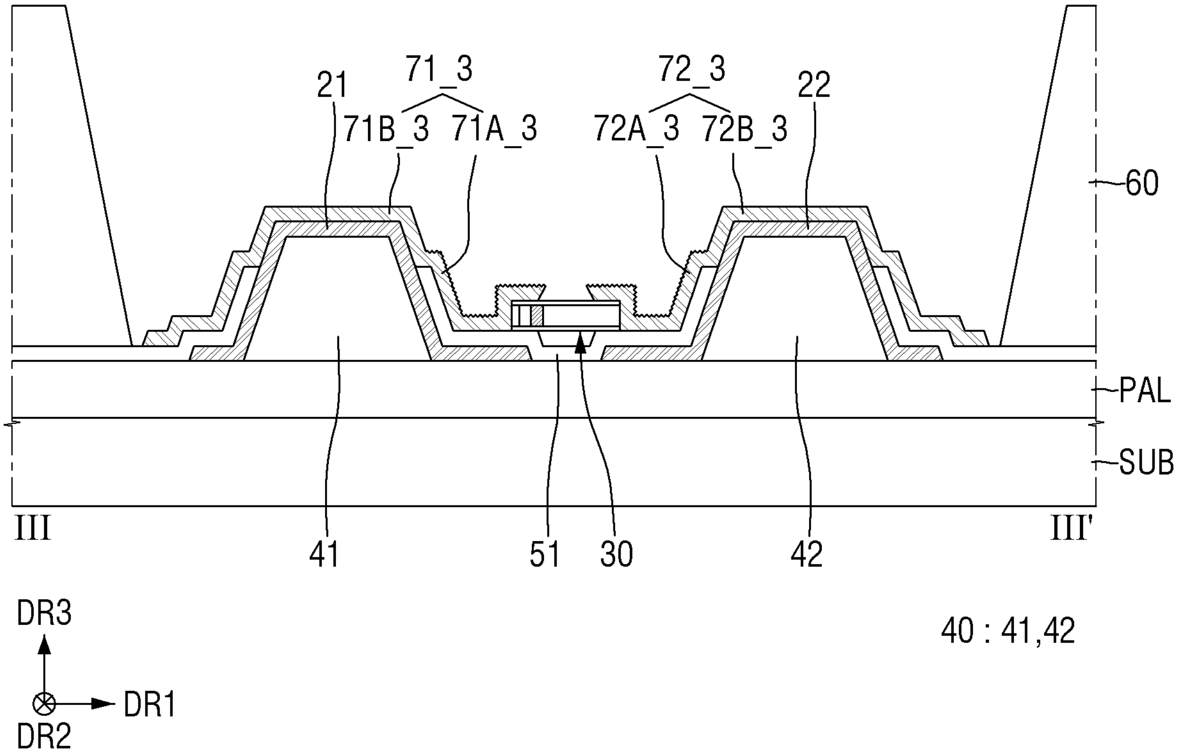

Referring to FIG. 31, the self-assembled monolayer SAM_1 may be removed. The self-assembled monolayer SAM_1 may be removed by an etching process. The second insulating layer 52 may be formed on the entire surface of the substrate SUB so that the display apparatus may be manufactured as shown in FIG. 24.

Figure 32:
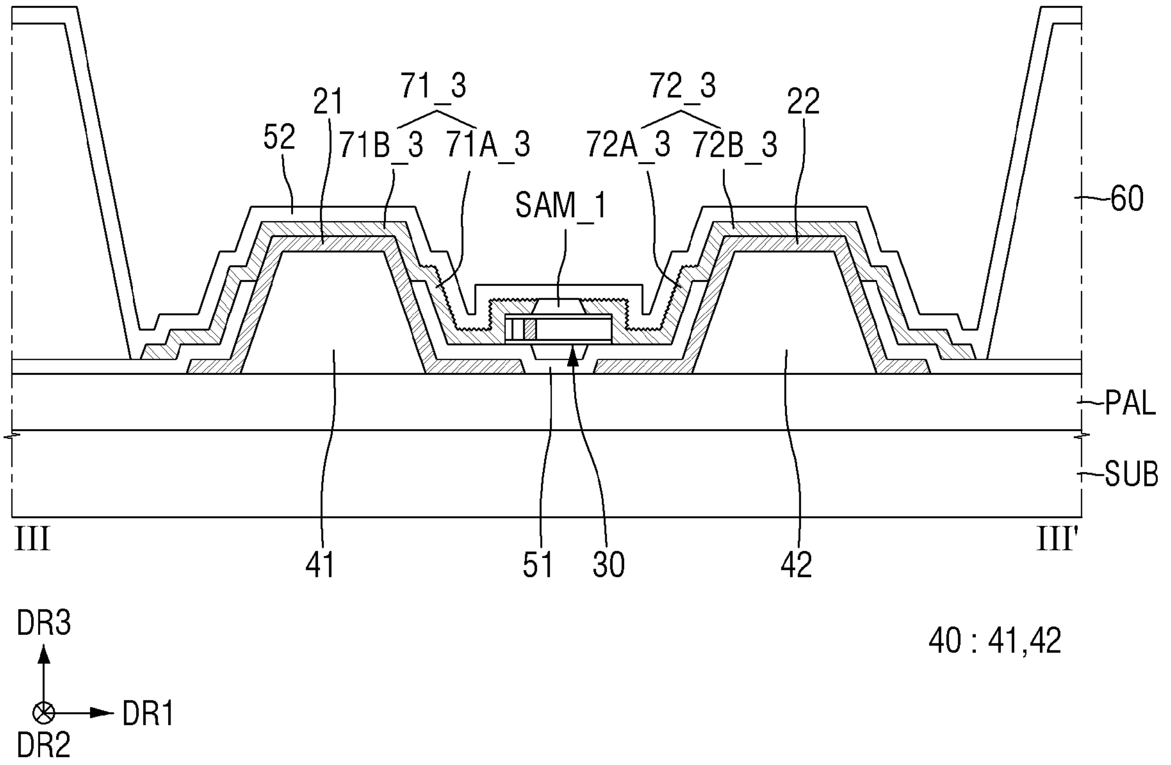
FIG. 32 is a schematic cross-sectional view taken along line III-III' of FIG. 2 according to an embodiment.

FIG. 32 is a schematic cross-sectional view taken along line III-III' of FIG. 2 according to an embodiment.

Referring to FIG. 32, the embodiment may be different from the embodiment of FIG. 24 in that a self-assembled monolayer SAM_1 is further disposed between the first contact electrode 71_3 and the second contact electrode 72_3 on the light emitting element 30.

For example, the self-assembled monolayer SAM_1 may be disposed between the first contact electrode 71_3 and the second contact electrode 72_3 on the light emitting element 30. The second insulating layer 52 may be disposed on the first contact electrode 71_3, the second contact electrode 72_3, and the self-assembled monolayer SAM_1. The self-assembled monolayer SAM_1 may be aligned in parallel with the upper surface of an end portion of each of the first contact electrode 71_3 and the second contact electrode 72_3.

In the embodiment, after the process of forming the first and second contact electrodes 71_3 and 72_3 is performed, in case that the second insulating layer 52 is formed without a separate process of removing the self-assembled monolayer SAM_1, the display apparatus may be manufactured as shown in FIG. 32.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

The invention claimed is:

1. A manufacturing method for a display apparatus, comprising:

preparing a substrate on which a first electrode and a second electrode are formed;

disposing a light emitting element between the first electrode and the second electrode;

forming a sacrificial pattern, which exposes an end portion and another end portion of the light emitting element, on the light emitting element;

forming a contact electrode layer on the sacrificial pattern, and the end portion and the another end portion of the light emitting element, which are exposed by the sacrificial pattern; and forming a first contact electrode and a second contact electrode by removing a portion of the contact electrode layer that is formed on the sacrificial pattern by using a first etchant and removing the sacrificial pattern by using the first etchant to expose the light emitting element.

2. The manufacturing method of claim 1, wherein the sacrificial pattern has a tapered shape in a cross-sectional view.

3. The manufacturing method of claim 1, wherein the contact electrode layer includes:

a first area that is formed on the sacrificial pattern and has a first thickness in a thickness direction of the substrate;

a second area that is formed on the end portion and the another end portion of the light emitting element, which are exposed by the sacrificial pattern, and has a second thickness in the thickness direction; and a third area that does not overlap the light emitting element and has a third thickness in the thickness direction, and the first thickness of the contact electrode layer is smaller than the second thickness of the contact electrode layer and the third thickness of the contact electrode layer.

4. The manufacturing method of claim 3, wherein the forming of the first contact electrode and the second contact electrode is performed by front etching using the first etchant.

5. The manufacturing method of claim 4, wherein an etching selectivity of the sacrificial pattern with the first etchant is greater than an etching selectivity of the contact electrode layer with the first etchant.

6. The manufacturing method of claim 4, wherein the forming of the first contact electrode and the second contact electrode comprises etching the first area of the contact electrode layer on the sacrificial pattern to expose the sacrificial pattern.

* * * * *